US012738310B2

(12) United States Patent
Kim

(10) Patent No.: US 12,738,310 B2
(45) Date of Patent: Sep. 15, 2026

(54) MEMORY DEVICE AND METHOD WITH TWO REFRESH CYCLES

(71) Applicant: SK hynix Inc., Gyeonggi-do (KR)

(72) Inventor: Saeng Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 245 days.

(21) Appl. No.: 18/527,367

(22) Filed: Dec. 4, 2023

(65) Prior Publication Data

US 2024/0339147 A1 Oct. 10, 2024

(30) Foreign Application Priority Data

Apr. 6, 2023 (KR) ........................ 10-2023-0045280
Oct. 23, 2023 (KR) ........................ 10-2023-0141848

(51) Int. Cl.
*G11C 11/406* (2006.01)
*G11C 11/4072* (2006.01)

(52) U.S. Cl.
CPC .. *G11C 11/40618* (2013.01); *G11C 11/40615* (2013.01); *G11C 11/4072* (2013.01)

(58) Field of Classification Search
CPC ........ G11C 11/40618; G11C 11/40615; G11C 11/4072; G11C 11/40611; G11C 11/408
See application file for complete search history.

(56) References Cited

U.S. PATENT DOCUMENTS 11,527,280 B2 12/2022 Bennett et al.
2017/0352400 A1* 12/2017 Kim .................... G11C 29/783
2020/0251158 A1 8/2020 Shore et al.
2022/0208293 A1* 6/2022 Kim .................. G11C 29/4401

FOREIGN PATENT DOCUMENTS

KR 10-2014834 B1 8/2019

* cited by examiner

*Primary Examiner* — Sultana Begum
(74) *Attorney, Agent, or Firm* — IP&T GROUP LLP

(57) ABSTRACT

A memory device includes a memory cell array including row-hammer cells configured to store a number of accesses of a corresponding row of a plurality of rows; an address control circuit configured to generate consecutive first and second refresh addresses according to a normal refresh command, wherein the first refresh address indicates an odd-numbered row during a first refresh cycle and an even-numbered row during a second refresh cycle; and a refresh control circuit configured to refresh, according to the normal refresh command, first and second rows respectively corresponding to the first and second refresh addresses and selectively initialize the row-hammer cells of the first row while refreshing the first row.

22 Claims, 20 Drawing Sheets

(a)
(b)
tREFW1
tREFW2
REF
REF_ADD1
REF_ADD2
RESET

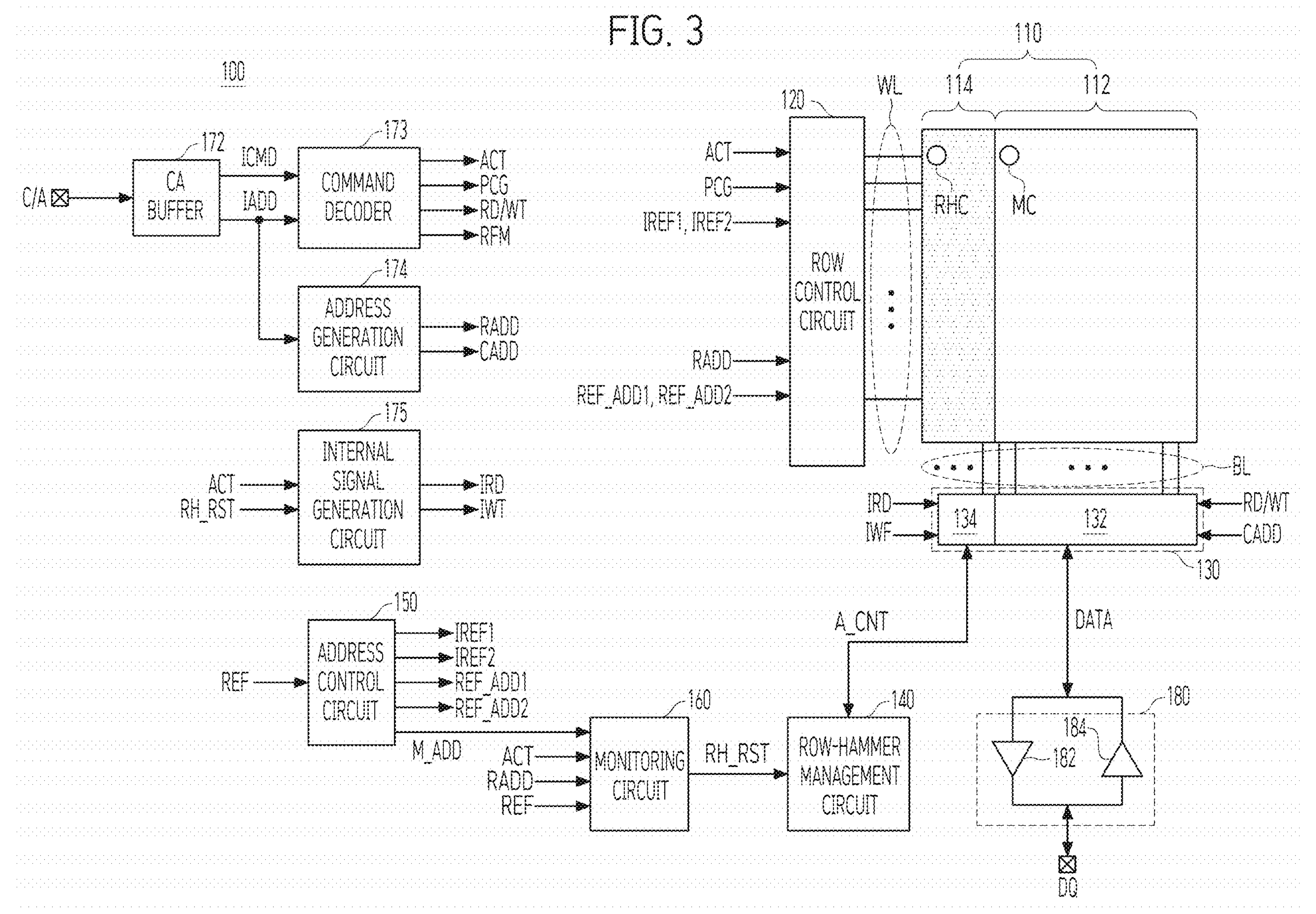
FIG. 3
100
C/A
172
CA BUFFER
ICMD
IADD
173
COMMAND DECODER
ACT
PCG
RD/WT
RFM
174
ADDRESS GENERATION CIRCUIT
RADD
CADD
175
INTERNAL SIGNAL GENERATION CIRCUIT
ACT
RH_RST
IRD
IWT
150
ADDRESS CONTROL CIRCUIT
REF
IREF1
IREF2
REF_ADD1
REF_ADD2
M_ADD
160
MONITORING CIRCUIT
ACT
RADD
REF
RH_RST
140
ROW-HAMMER MANAGEMENT CIRCUIT
A_CNT
120
ROW CONTROL CIRCUIT
ACT
PCG
IREF1, IREF2
RADD
REF_ADD1, REF_ADD2
WL
110
114
112
RHC
MC
BL
IRD
IWF
134
132
RD/WT
CADD
130
DATA
180
184
182
DQ

FIG. 8A

FIG. 8B tREFW2

Figure 8B:
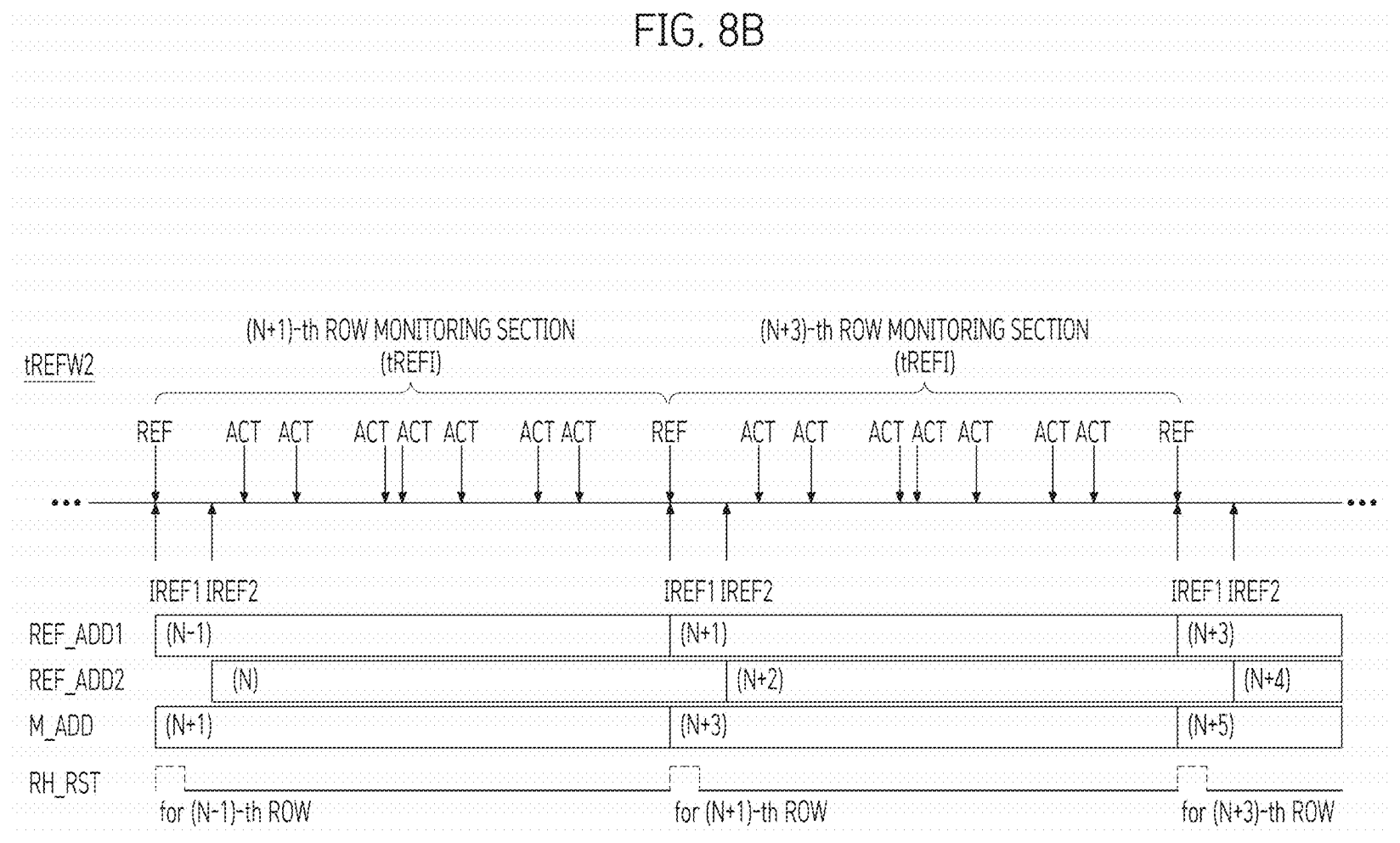

(N+1)-th ROW MONITORING SECTION (tREFI)

(N+3)-th ROW MONITORING SECTION (tREFI)

REF ACT ACT ACT ACT ACT ACT ACT ACT REF ACT ACT ACT ACT ACT ACT ACT ACT REF

IREF1 IREF2 IREF1 IREF2 IREF1 IREF2

REF_ADD1 (N-1) (N+1) (N+3)

REF_ADD2 (N) (N+2) (N+4)

M_ADD (N+1) (N+3) (N+5)

RH_RST for (N-1)-th ROW for (N+1)-th ROW for (N+3)-th ROW

START
S100
Selectively initialize RH cells of odd-numbered row while sequentially refreshing two consecutive rows starting from odd-numbered row, during first refresh cycle
S200
Selectively initialize RH cells of even-numbered row while sequentially refreshing two consecutive rows starting from even-numbered row, during second refresh cycle
END S180
START
S182
Input active command (ACT)
S184
Generate active address (ACT_ADD)
S186
Compare active address (ACT_ADD)
with monitoring address (M_ADD)
S188
Match?
NO
YES
S189
Increase active count value (ACT_CNT)
END

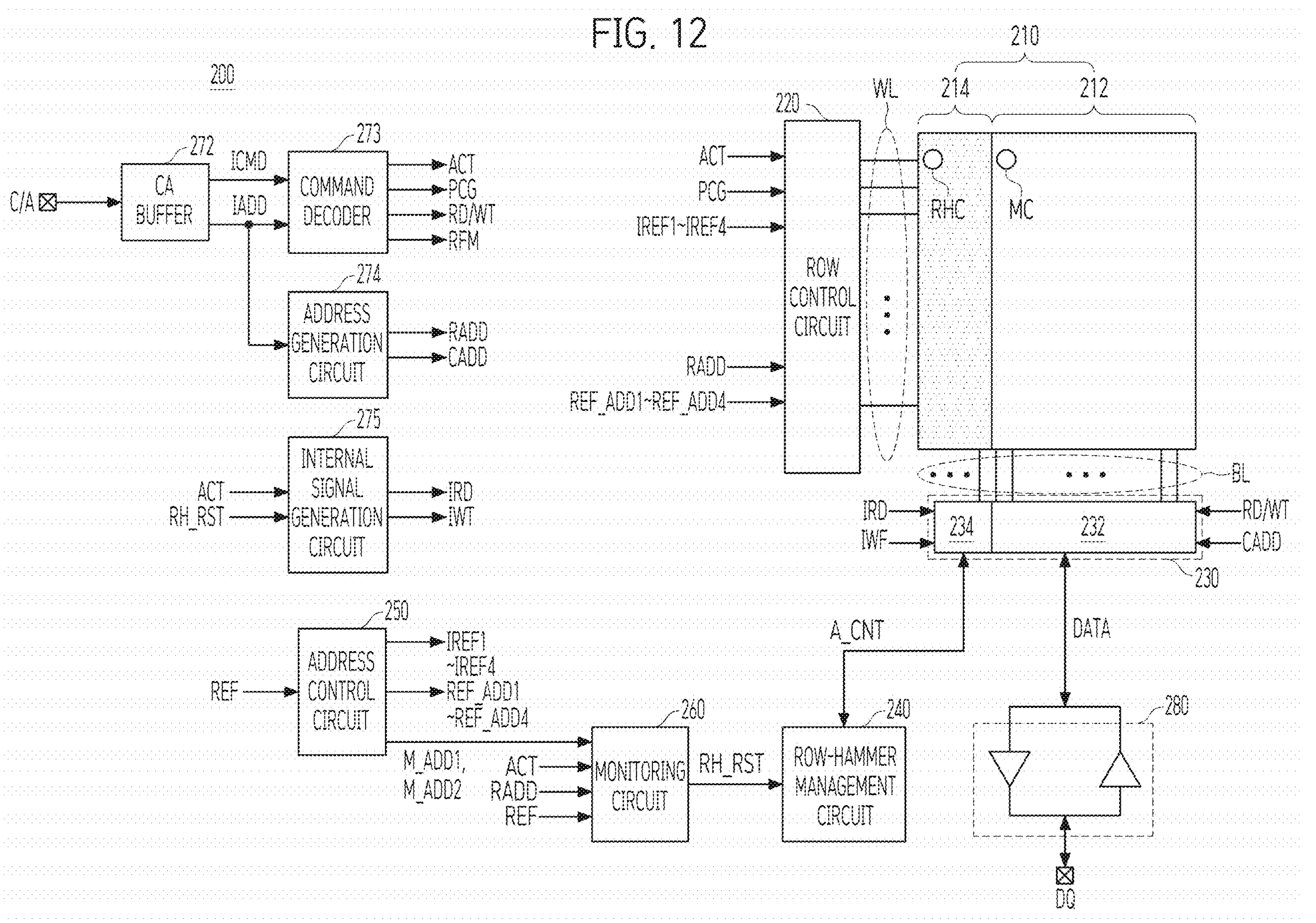
FIG. 12
200
C/A
272
CA BUFFER
ICMD
IADD
273
COMMAND DECODER
ACT
PCG
RD/WT
RFM
274
ADDRESS GENERATION CIRCUIT
RADD
CADD
275
INTERNAL SIGNAL GENERATION CIRCUIT
ACT
RH_RST
IRD
IWT
250
ADDRESS CONTROL CIRCUIT
REF
IREF1 ~IREF4
REF_ADD1 ~REF_ADD4
M_ADD1, M_ADD2
ACT
RADD
REF
260
MONITORING CIRCUIT
RH_RST
240
ROW-HAMMER MANAGEMENT CIRCUIT
A_CNT
220
ROW CONTROL CIRCUIT
ACT
PCG
IREF1~IREF4
RADD
REF_ADD1~REF_ADD4
WL
210
214
212
RHC
MC
BL
230
234
232
IRD
IWF
RD/WT
CADD
DATA
280
DQ tREFW1
tREFW2
REF
REF
REF
REF
PD_M
"L"
"H"
IREF1
IREF2
IREF3
IREF4
REF_ADD1
N-4
N
N-2
N+2
REF_ADD1
N-3
N+1
N-1
N+3
REF_ADD3
N-2
N+2
N
N+4
REF_ADD4
N-1
N+3
N+1
N+5
M_ADD1
N
N+4
N+2
N+6
M_ADD2
N+1
N+5
N+3
N+7

FIG. 16A tREFW1

Figure 16A:
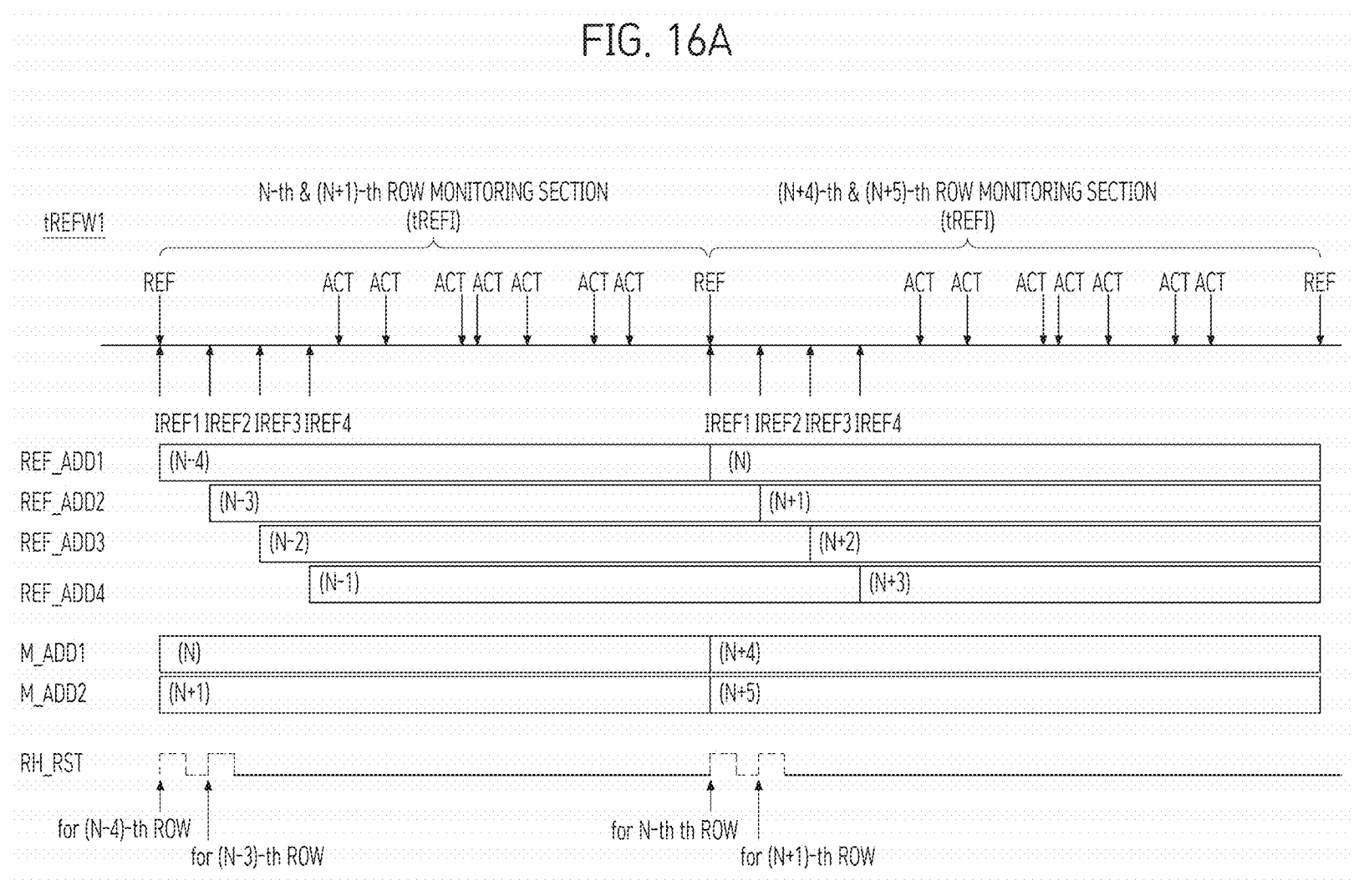

N-th & (N+1)-th ROW MONITORING SECTION
(tREFI)

(N+4)-th & (N+5)-th ROW MONITORING SECTION
(tREFI)

REF ACT ACT ACT ACT ACT ACT ACT ACT REF ACT ACT ACT ACT ACT ACT ACT ACT REF

IREF1 IREF2 IREF3 IREF4

IREF1 IREF2 IREF3 IREF4

REF_ADD1 (N-4) (N)

REF_ADD2 (N-3) (N+1)

REF_ADD3 (N-2) (N+2)

REF_ADD4 (N-1) (N+3)

M_ADD1 (N) (N+4)

M_ADD2 (N+1) (N+5)

RH_RST for (N-4)-th ROW for (N-3)-th ROW for N-th th ROW for (N+1)-th ROW

MEMORY DEVICE AND METHOD WITH TWO REFRESH CYCLES

CROSS-REFERENCE TO RELATED APPLICATIONS

The present application claims priority of Korean Patent Application Nos. 10-2023-0045280 and 10-2023-0141848, respectively filed on Apr. 6, 2023 and Oct. 23, 2023, which are incorporated herein by reference in their entirety.

BACKGROUND

1. Field

Various embodiments of the present invention relate to a semiconductor designing technology, and more particularly, to a memory device for initializing row-hammer cells included therein.

2. Description of the Related Art

In addition to a normal refresh operation that is sequentially performed on memory cells of a plurality of word lines, an additional refresh operation which will be, hereinafter, referred to as a 'target refresh operation', is being performed on memory cells of a specific word line that is likely to lose data due to a row-hammer phenomenon. The row-hammer phenomenon refers to a phenomenon in which data of memory cells coupled to a specific word line or the word lines disposed adjacent to the word line are damaged due to a high number of accesses (or activations) of the corresponding word line. To prevent the row-hammer phenomenon, a target refresh operation is performed on a word line (referred to as a 'target word line') that is activated more than a predetermined number of times and word lines disposed adjacent to the word line.

Recently, a method in which a memory device arranges additional row-hammer cells for each word line, stores the number of accesses of the word line in the row-hammer cells, and selects a target word line based on the stored data has been used. Therefore, various methods for managing the row-hammer cells are being studied.

SUMMARY

Embodiments of the present invention are directed to a memory device capable of initializing row-hammer cells according to a normal refresh command that is periodically provided, and an operating method thereof.

According to an embodiment of the present invention, a memory device includes a memory cell array including row-hammer cells configured to store a number of accesses of a corresponding row of a plurality of rows; an address control circuit configured to generate consecutive first and second refresh addresses according to a normal refresh command, wherein the first refresh address indicates an odd-numbered row during a first refresh cycle and an even-numbered row during a second refresh cycle; and a refresh control circuit configured to refresh, according to the normal refresh command, first and second rows respectively corresponding to the first and second refresh addresses and selectively initialize the row-hammer cells of the first row while refreshing the first row.

According to an embodiment of the present invention, a memory device includes a memory cell array including row-hammer cells configured to store a number of accesses of a corresponding row of a plurality of rows; an address control circuit configured to generate consecutive 2k refresh addresses according to a normal refresh command, wherein the refresh addresses start from a starting refresh address indicating an n-th row during a first refresh cycle and a (n+k)-th row during a second refresh cycle; and a refresh control circuit configured to sequentially refresh, according to the normal refresh command, 2k rows respectively corresponding to the 2k refresh addresses and selectively initialize the row-hammer cells of k rows among the 2k rows while first refreshing the k rows, wherein each of n and k is an integer greater than or equal to 1.

According to an embodiment of the present invention, an operating method of a memory device including row-hammer cells configured to store a number of accesses of a corresponding row of a plurality of rows, includes repeatedly performing, according to a normal refresh command during a first refresh cycle, an operation of sequentially refreshing two consecutive rows starting from an odd-numbered row of the rows while selectively initializing the row-hammer cells of the odd-numbered row; and repeatedly performing, according to the normal refresh command during a second refresh cycle, an operation of sequentially refreshing two consecutive rows starting from an even-numbered row of the rows while selectively initializing the row-hammer cells of the even-numbered row.

According to an embodiment of the present invention, an operating method of a memory device including row-hammer cells configured to store a number of accesses of a corresponding row of a plurality of rows, includes repeatedly performing, according to a normal refresh command during a first refresh cycle, an operation of sequentially refreshing consecutive (3k−2)-th to 3k-th rows while selectively initializing row-hammer cells of the (3k−1)-th row; repeatedly performing, according to the normal refresh command during a second refresh cycle, an operation of sequentially refreshing consecutive (3k−1)-th to (3k+1)-th rows while selectively initializing row-hammer cells of the 3k-th row; and repeatedly performing, according to the normal refresh command during a third refresh cycle, an operation of sequentially refreshing consecutive 3k-th to (3k+2)-th rows while selectively initializing row-hammer cells of the (3k+1)-th row, wherein k is an integer greater than or equal to 1.

According to an embodiment of the present invention, an operating method of a memory device including row-hammer cells configured to store a number of accesses of a corresponding row of a plurality of rows, includes repeatedly performing, according to a normal refresh command during a first refresh cycle, an operation of sequentially refreshing consecutive 2k rows starting from an n-th row while selectively initializing row-hammer cells of k rows that are first refreshed among the 2k rows starting from the n-th row; and repeatedly performing, according to the normal refresh command during a second refresh cycle, an operation of sequentially refreshing consecutive 2k rows starting from a (n+k)-th row while selectively initializing row-hammer cells of k rows that are first refreshed among the 2k rows starting from the (n+k)-th row, wherein each of k and n is an integer greater than or equal to 1.

According to an embodiment of the present invention, an operating method of a memory device including rows each having cells configured to store therein a number of accesses to the row, the operating method includes performing different groups of refresh operations at corresponding cycles to the respective groups. The operating method includes each of the groups is performed to refresh all rows once during the corresponding cycle, wherein the refresh operations within each of the groups are sequentially performed in units of bunches corresponding to respective arrays of consecutive rows from the rows, foremost rows in the arrays being of different kinds according to the groups, and wherein each of the bunches includes an operation of initializing the cells of a selected row within a corresponding array of the arrays when the number corresponding to the selected row is less than a threshold.

According to embodiments of the present invention, the memory device may initialize the row-hammer cells without checking the counting data stored in the row-hammer cells, thereby minimizing the power consumption while maintaining the row-hammer attack defense capability.

These and other features and advantages of the invention will become apparent from the detailed description of embodiments of the invention and the following figures.

BRIEF DESCRIPTION OF THE DRAWINGS

FIG. 3 is a block diagram illustrating a memory device in accordance with an embodiment of the present invention.

FIGS. 8A and 8B are timing diagrams for describing an operation of the monitoring circuit of FIG. 7.

FIG. 12 is a block diagram illustrating a memory device according to another embodiment of the present invention.

FIGS. 16A and 16B are timing diagrams for describing an operation of the monitoring circuit of FIG. 15.

DETAILED DESCRIPTION

Figure 1:
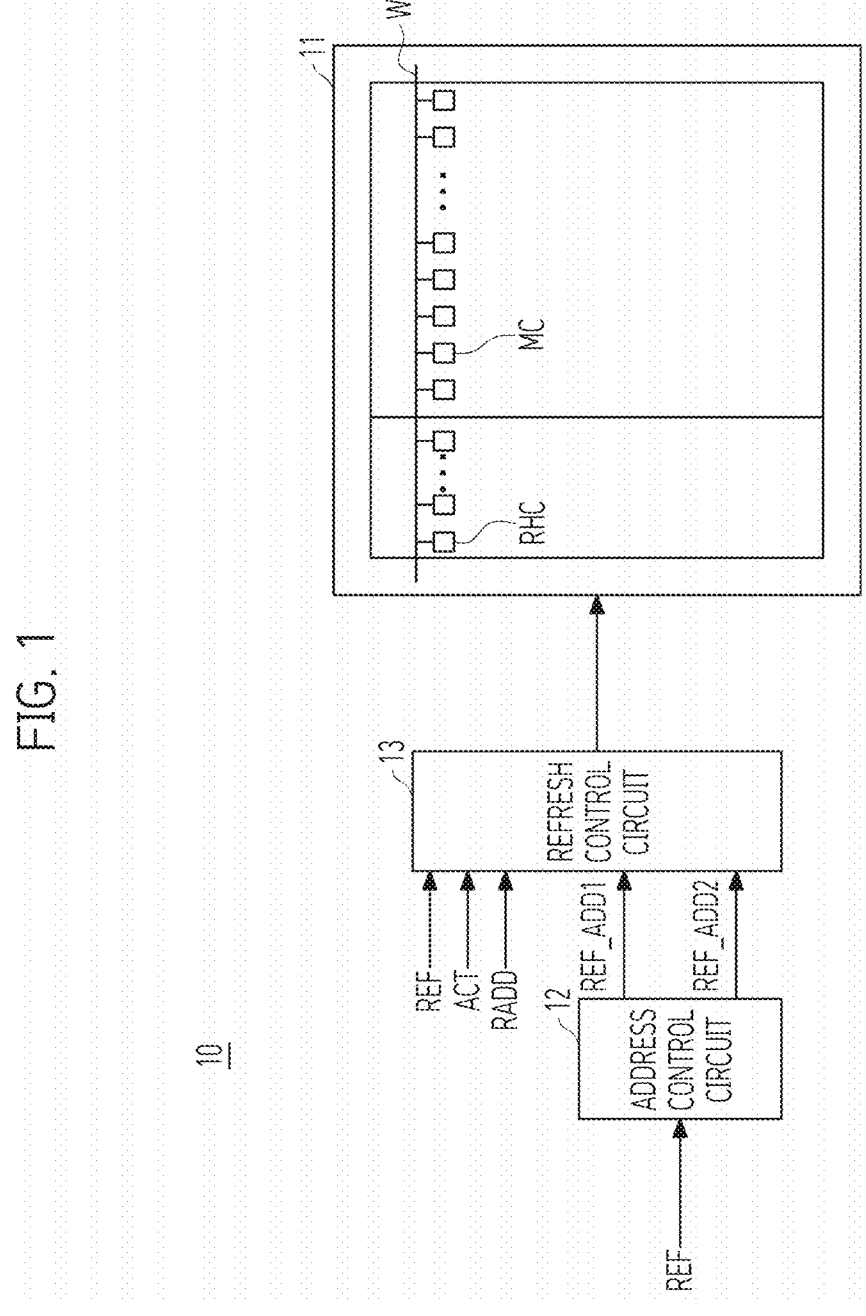
FIG. 1 is a schematic block diagram illustrating a memory device according to an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Typically, a volatile memory device such as a DRAM needs a refresh operation to secure a data retention time. The refresh operation may include a normal refresh operation in which the memory device sequentially refreshes a plurality of word lines (hereinafter referred to as "a plurality of rows"), and a target refresh operation in which one or more adjacent rows (or victim rows) adjacent to a target row (or an aggressor row) with a high number of activations or a high frequency of activation are refreshed.

For the normal refresh operation, the memory controller may periodically provide the memory device with a preset number of normal refresh commands within a time (i.e., a refresh window tREFW) when all memory cells need to be refreshed. For example, the memory controller may provide 8K (8192) normal refresh commands to the memory device within a refresh window tREFW of 32 ms. For the target refresh operation, the memory device may generate a target refresh command internally whenever the number of times the normal refresh command is input reaches a preset number or a preset condition. Alternatively, the memory controller may non-periodically provide a refresh management command to the memory device in a situation where a row-hammer phenomenon may occur, for example, when the number of issuances of an active command reaches a target number.

The memory device may arrange row-hammer cells for each row and increase a value of counting data stored in the row-hammer cells of a selected row when an active command is input. The memory device may select a target row for a target refresh operation based on the counting data stored in the row-hammer cells of each row. To initialize the row-hammer cells, the memory device may read out the counting data from the selected row and determine whether or not adjacent rows adjacent to the selected row are vulnerable to the row-hammer based on the counting data. The memory device may initialize the row-hammer cells of the selected row only when the counting data is confirmed to be a value less than a threshold. In this case, the power consumption increased for reading and comparing the counting data from the row-hammer cells, and the counting data continued to accumulate until the counting data of the row-hammer cells reached the threshold, making it difficult to manage the row-hammer attack defense.

Hereinafter, in accordance with embodiments of the present invention, a method of efficiently initializing row-hammer cells will be discussed.

FIG. 1 is a schematic block diagram illustrating a memory device 10 according to an embodiment of the present invention.

Referring to FIG. 1, the memory device 10 may include a memory cell array 11, an address control circuit 12, and a refresh control circuit 13.

The memory cell array 11 may include a plurality of normal cells MC and a plurality of row-hammer cells RHC respectively coupled to each of a plurality of rows WL. The plurality of row-hammer cells RHC may store the number of accesses (or activations) to a corresponding row as counting data.

The address control circuit 12 may generate a first refresh address REF_ADD1 and a second refresh address REF_ADD2, which have consecutive values, according to a normal refresh command REF. The address control circuit 12 may generate the first refresh address REF_ADD1 to start with a value designating an odd-numbered row during a first refresh cycle and a value designating an even-numbered row during a second refresh cycle. The first refresh address REF_ADD1 and the second refresh address REF_ADD2 may be repeatedly generated during each of the first refresh cycle and the second refresh cycle within a refresh window (tREFW) set to refresh all of the plurality of rows WL. The address control circuit 12 may generate the first refresh address REF_ADD1 and the second refresh address REF_ADD2 by increasing each of the first refresh address REF_ADD1 and the second refresh address REF_ADD2 by "+2" each time the normal refresh command REF is input.

The refresh control circuit 13 may increase, according to an active command ACT, counting data stored in row-hammer cells RHC of a row corresponding to a row address RADD among a plurality of rows WL. Accordingly, the number of accesses of the row may be stored in the plurality of row-hammer cells RHC as the counting data.

The refresh control circuit 13 may sequentially refresh a first row and a second row corresponding to the first refresh address REF_ADD1 and the second refresh address REF_ADD2, respectively, and selectively initialize the row-hammer cells of the first row while refreshing the first row. In particular, the refresh control circuit 13 may monitor the number of accesses (or activations) of the first row during a previous refresh interval (tREFI) corresponding to a section from an input of a previous normal refresh command REF to an input of a current normal refresh command REF and may initialize, based on the monitoring result, the row-hammer cells of the first row while refreshing the first row. The refresh control circuit 13 may initialize the row-hammer cells of the first row when the monitored number of activations of the first row is less than a preset threshold.

Figure 2:
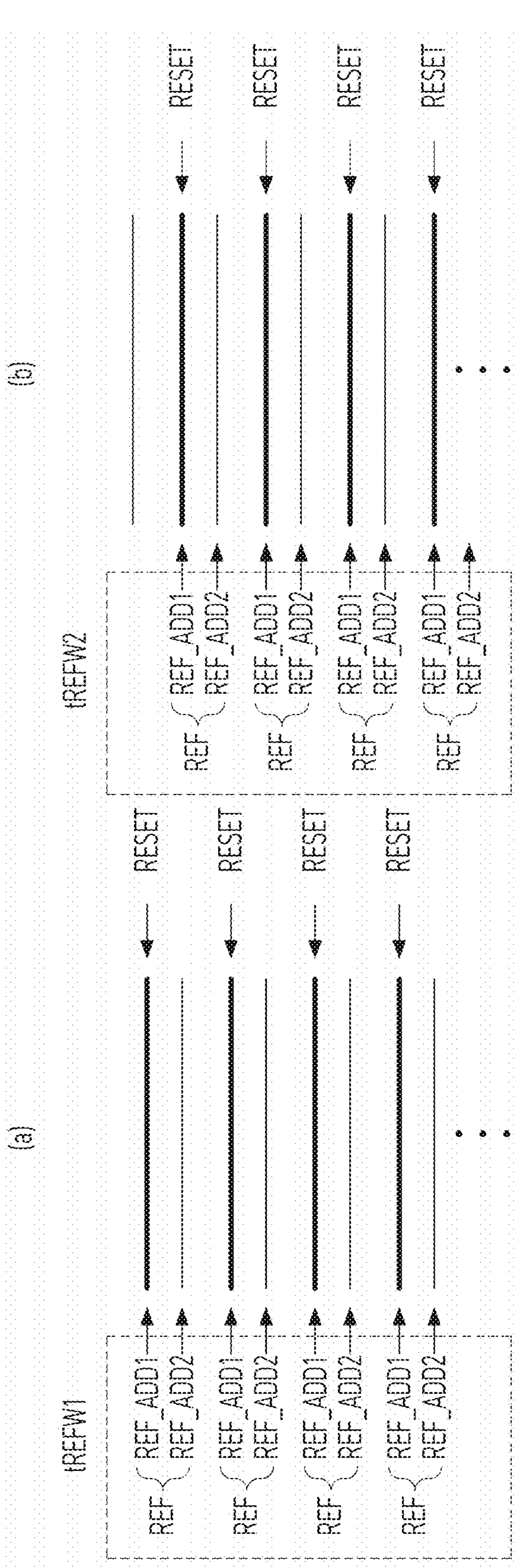
FIG. 2 is a diagram for describing a method of initializing row-hammer cells of FIG. 1.

FIG. 2 is a diagram for describing a method of initializing row-hammer cells of FIG. 1.

Referring to (a) of FIG. 2, the address control circuit 12 may generate, each time a normal refresh command REF is input during a first refresh cycle tREFW1, a first refresh address REF_ADD1 that increases by "+2" starting from a value designating an odd-numbered row and a second refresh address REF_ADD2 that increases by "+2" starting from a value designating an even-numbered row. That is, the address control circuit 12 may generate, during the first refresh cycle tREFW1, the first refresh address REF_ADD1 for sequentially designating odd-numbered rows and the second refresh address REF_ADD2 for sequentially designating even-numbered rows. The refresh control circuit 13 may sequentially refresh, according to the normal refresh command REF, the first row and the second row respectively corresponding to the first refresh address REF_ADD1 and the second refresh address REF_ADD2. Further, the refresh control circuit 13 may selectively initialize the row-hammer cells of the first row while refreshing the first row designated by the first refresh address REF_ADD1. The refresh control circuit 13 may monitor the number of activations of the first row during the previous refresh interval (tREFI) and may initialize, based on the monitoring result, the row-hammer cells of the first row during the refresh of the first row. Accordingly, during the first refresh cycle tREFW1, the odd-numbered rows may be selectively initialized.

Referring to (b) of FIG. 2, the address control circuit 12 may generate, each time the normal refresh command REF is input during a second refresh cycle tREFW2, a first refresh address REF_ADD1 that increases by "+2" starting from a value designating the even-numbered row and a second refresh address REF_ADD2 that increases by "+2" starting from a value designating the odd-numbered row. That is, the address control circuit 12 may generate, during the second refresh cycle tREFW2, the first refresh address REF_ADD1 for sequentially designating even-numbered rows and the second refresh address REF_ADD2 for sequentially designating odd-numbered rows. The refresh control circuit 13 may sequentially refresh, according to the normal refresh command REF, the first row and the second row respectively corresponding to the first refresh address REF_ADD1 and the second refresh address REF_ADD2. Further, the refresh control circuit 13 may selectively initialize the row-hammer cells of the first row while refreshing the first row designated by the first refresh address REF_ADD1. The refresh control circuit 13 may monitor the number of activations of the first row during the previous refresh interval (tREFI) and may initialize, based on the monitoring result, the row-hammer cells of the first row during the refresh of the first row. Accordingly, during the second refresh cycle tREFW2, the even-numbered rows may be selectively initialized.

As described above, in an embodiment of the present invention, the odd-numbered rows are selectively initialized during the first refresh cycle, and even-numbered rows are selectively initialized during the second refresh cycle, so that the row-hammer cells of all rows during the first and second refresh cycles may be initialized.

When the row-hammer cells of a specific m-th row are initialized while refreshing the specific m-th row according to the normal refresh command REF, the degree of damage to adjacent rows (e.g., (m−1)-th row and (m+1)-th row) due to the row-hammer phenomenon cannot be estimated. In an embodiment of the present invention, since two consecutive rows are refreshed according to the normal refresh command REF, even if the row-hammer cells of the specific m-th row are initialized, the next adjacent row (i.e., the (m+1)-th row) is immediately refreshed and the possibility of damage caused by the row-hammer is low. In addition, in an embodiment of the present invention, it is possible to minimize the possibility of damage to previous adjacent rows (especially (m−1)-th rows) by selectively initializing the row-hammer cells of the specific m-th row according to the monitoring result of monitoring the number of activations of the specific m-th row.

Hereinafter, a configuration and an operation of a memory device will be described with reference to specific embodiments.

Figure 4:
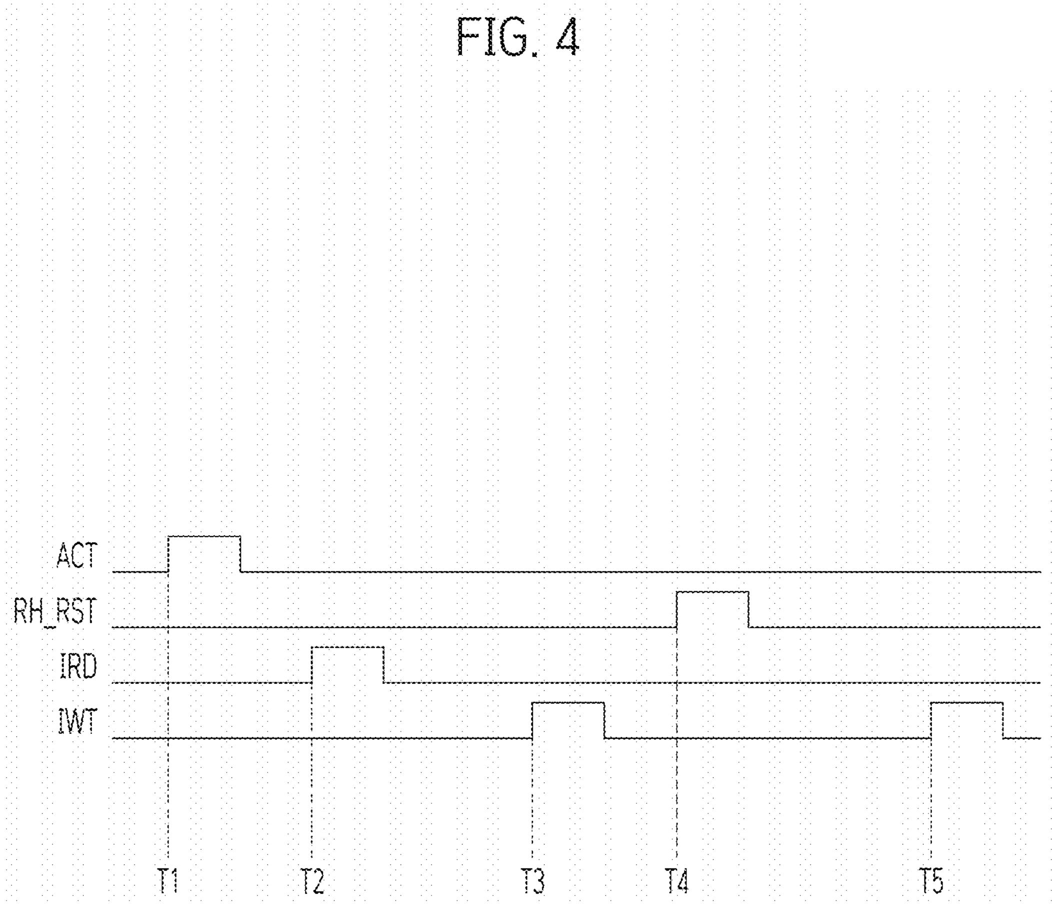
FIG. 4 is a timing diagram for describing an operation of an internal signal generation circuit of FIG. 3.

FIG. 3 is a block diagram illustrating a memory device 100 in accordance with an embodiment of the present invention. FIG. 4 is a timing diagram for describing an operation of an internal signal generation circuit 175 of FIG. 3.

Referring to FIG. 3, the memory device 100 may include a memory cell region 110, a row control circuit 120, a column control circuit 130, a row-hammer management circuit 140, an address control circuit 150, a monitoring circuit 160, a command/address (CA) buffer 172, a command decoder 173, an address generation circuit 174, the internal signal generation circuit 175, and a data input/output circuit 180.

The memory cell region 110 may include a plurality of memory cells MC and RHC respectively coupled to a plurality of rows WL and a plurality of columns BL. The plurality of rows WL may extend in a first direction (e.g., a row direction) and may be sequentially disposed in a second direction (e.g., a column direction). The plurality of columns BL may extend in the column direction and may be sequentially disposed in the row direction. The plurality of memory cells MC and RHC may be composed of memory cells that require a refresh operation to secure data retention time. The memory cell region 110 may be composed of at least one bank. The number of banks or the number of memory cells MC and RHC may be determined depending on the capacity of the memory device 100.

In accordance with an embodiment, the memory cell region 110 may be divided into a normal cell region 112 and a row-hammer cell region 114. A plurality of normal cells MC may be arranged in an array type in the normal cell region 112, and a plurality of row-hammer cells RHC may be arranged in an array type in the row-hammer cell region 114. The plurality of normal cells MC and the plurality of row-hammer cells RHC may be coupled to each of the rows WL. The plurality of normal cells MC may store normal data DATA including user data, and the plurality of row-hammer cells RHC may store counting data A_CNT for storing the number of accesses (or activations) to a corresponding row.

The CA buffer 172 may receive a command/address signal C/A from an external device (e.g., a memory controller). The CA buffer 172 may buffer the command/address signal C/A to output an internal command ICMD and an internal address IADD.

The command decoder 173 may decode the internal command ICMD output from the CA buffer 172 to generate an active command ACT, a precharge command PCG, a read command RD, and a write command WT. Further, the command decoder 173 may decode the internal command ICMD to generate a normal refresh command REF as a periodic refresh command. Although not shown in FIG. 3, the command decoder 173 may decode the internal command ICMD to generate a refresh management command as a non-periodic refresh command signal.

The address generation circuit 174 may classify the internal address IADD received from the CA buffer 172 as a row address RADD and a column address CADD. Depending on an embodiment, the address generation circuit 174 may classify some bits of the internal address IADD as a row address RADD and classify the remaining bits as a column address CADD. The address generation circuit 174 may classify the internal address IADD as a row address RADD when an active operation is directed as a result of the decoding by the command decoder 173 and may classify the internal address IADD as a column address CADD when a read or write operation is directed. The plurality of rows WL may be accessed by the row address RADD, and the plurality of columns BL may be accessed by the column address CADD.

The internal signal generation circuit 175 may sequentially generate an internal read signal IRD and an internal write signal IWT when the active command ACT is input. The internal signal generation circuit 175 may generate the internal write signal IWT when a row-hammer reset signal RH_RST is input. For example, referring to FIG. 4, when the active command ACT is input at a time of T1, the internal signal generation circuit 175 may generate the internal read signal IRD at a time of T2. After that, the internal signal generation circuit 175 may generate the internal write signal IWT at a time of T3. In addition, when the row-hammer reset signal RH_RST is input at a time of T4, the internal signal generation circuit 175 may generate the internal write signal IWT at a time of T5.

Referring back to FIG. 3, the row control circuit 120 may be coupled to the normal cells MC in the normal cell region 112 and the row-hammer cells RHC in the row-hammer cell region 114, through the rows WL. The row control circuit 120 may select or activate at least one row selected by the row address RADD when the active command ACT is input and deactivate the activated row when the precharge command PCG is input. During a normal refresh operation, the row control circuit 120 may sequentially refresh the plurality of rows WL. In an embodiment of the present invention, when one refresh command REF is input during a normal refresh operation, the row control circuit 120 may refresh two consecutive rows according to a first refresh address REF_ADD1 and a second refresh address REF_ADD2. The row control circuit 120 may refresh a row corresponding to the first refresh address REF_ADD1 according to a first internal refresh signal IREF1 and may refresh a row corresponding to the second refresh address REF_ADD2 according to a second internal refresh signal IREF2.

The column control circuit 130 may include a first column control circuit 132 corresponding to the normal cell region 112, and a second column control circuit 134 corresponding to the row-hammer cell region 114. The first column control circuit 132 and the second column control circuit 134 may be coupled to the normal cells MC of the normal cell region 112 and the row-hammer cells RHC of the row-hammer cell region 114, respectively through the separated columns BL.

The first column control circuit 132 may select some columns among the columns BL, according to the column address CADD, read out the normal data DATA from the normal cells MC through the selected columns in response to the read command RD, and write the normal data DATA provided from the memory controller into the normal cells MC through the selected columns in response to the write command WT. The first column control circuit 132 may be coupled to a data pad through the data input/output circuit 180 to transmit and receive data DQ to and from the memory controller.

The second column control circuit 134 may read out the counting data A_CNT from the row-hammer cells RHC of the row-hammer cell region 114, to output the read counting data A_CNT to the row-hammer management circuit 140, according to the internal read signal IRD. The second column control circuit 134 may receive updated counting data A_CNT from the row-hammer management circuit 140 to write back the updated counting data A_CNT to the row-hammer cells RHC of the row-hammer cell region 114, according to the internal write signal IWT.

The row-hammer management circuit 140 may update the counting data A_CNT provided from the second column control circuit 134. For example, the row-hammer management circuit 140 may increase a value of the counting data A_CNT by "+1". The row-hammer management circuit 140 may provide the updated counting data A_CNT to the second column control circuit 134. The second column control circuit 134 may write back the updated counting data A_CNT to the row-hammer cells RHC of the row-hammer cell region 114, according to the internal write signal IWT that is activated according to the active command ACT. In an embodiment of the present invention, the row-hammer management circuit 140 may initialize the counting data A_CNT to a specific value (e.g., an all-zero value) according to the row-hammer reset signal RH_RST. Depending on an embodiment, the row-hammer management circuit 140 may initialize the counting data A_CNT to a random value. The second column control circuit 134 may write-back the initialized counting data A_CNT to the row-hammer cells RHC according to the internal write signal IWT that is activated according to the row-hammer reset signal RH_RST.

Depending on an embodiment, the memory device 100 may further include a target command generation circuit for generating a target refresh command whenever the number of inputs of the normal refresh command REF reaches a preset number or a preset condition. That is, the refresh management command RFM may be a command provided from the memory controller for the target refresh operation, and the target refresh command may be a command generated by the memory device 100 itself for the target refresh operation. Although not shown in FIG. 3, the row-hammer management circuit 140 may sample the row address RADD based on the counting data A_CNT and select and output one of the sampled addresses as the target address according to the refresh management command RFM or the target refresh command. The row control circuit 120 may perform a target refresh operation for refreshing adjacent rows of a target row corresponding to the target address according to the refresh management command RFM or the target refresh command. After the target address is output, the row-hammer management circuit 140 may initialize the counting data A_CNT to a specific value (e.g., an all-zero value). When the refresh management command RFM or the target refresh command is input, the internal signal generation circuit 175 may additionally activate the internal write signal IWT, and the second column control circuit 134 may write-back the initialized counting data A_CNT to the row-hammer cells RHC according to the internal write signal IWT.

The address control circuit 150 may generate, according to the normal refresh command REF, a first refresh address REF_ADD1, a second refresh address REF_ADD2, and a monitoring address M_ADD, which have consecutive values. The address control circuit 150 may generate the first refresh address REF_ADD1 to start with a value designating an odd-numbered row during a first refresh cycle, and to start with a value designating an even-numbered row during a second refresh cycle. For example, during the first refresh cycle, the address control circuit 150 may generate the first refresh address REF_ADD1 for designating an odd-numbered row and the second refresh address REF_ADD2 for designating an even-numbered row each time the normal refresh command REF is input. Further, during the second refresh cycle, the address control circuit 150 may generate the first refresh address REF_ADD1 for designating an even-numbered row and the second refresh address REF_ADD2 for designating an odd-numbered row. The first refresh address REF_ADD1 and the second refresh address REF_ADD2 may be repeatedly generated during each of the first refresh cycle and the second refresh cycle within a refresh window (tREFW) set to refresh all rows.

The address control circuit 150 may increase each value of the first refresh address REF_ADD1, the second refresh address REF_ADD2, and the monitoring address M_ADD by "+2" each time the normal refresh command REF is input. The address control circuit 150 may sequentially activate the first internal refresh signal IREF1 and the second internal refresh signal IREF2 according to the normal refresh command REF. The address control circuit 150 may generate the first refresh address REF_ADD1 in synchronization with the first internal refresh signal IREF1 and generate the second refresh address REF_ADD2 in synchronization with the second internal refresh signal IREF2. A detailed configuration and operation of the address control circuit 150 will be described with reference to FIGS. 5 and 6.

The monitoring circuit 160 may generate the row-hammer reset signal RH_RST by monitoring the number of activations of a row (hereinafter referred to as a "monitoring row") corresponding to the monitoring address M_ADD during a refresh interval (tREFI) defined by two adjacent normal refresh commands REF. For example, the monitoring circuit 160 may increase an active counting value (ACT_CNT of FIG. 7) when the row address RADD input with the active command ACT is identical to the monitoring address M_ADD. According to the normal refresh command REF, the monitoring circuit 160 may compare the active counting value ACT_CNT with a preset threshold to activate the row-hammer reset signal RH_RST only when the active counting value ACT_CNT is less than the preset threshold. A detailed configuration and operation of the monitoring circuit 160 will be described with reference to FIGS. 7 to 8B.

The data input/output circuit 180 may be coupled between the column control circuit 130 and the data pad to transmit and receive the normal data DATA to and from the memory controller. The data input/output circuit 180 may include a data output circuit 182 and a data input circuit 184. The data output circuit 182 may output the normal data DATA read from the memory cell region 110 to the data pad. The data input circuit 184 may receive the normal data DATA provided from the memory controller through the data pad.

Figure 5:
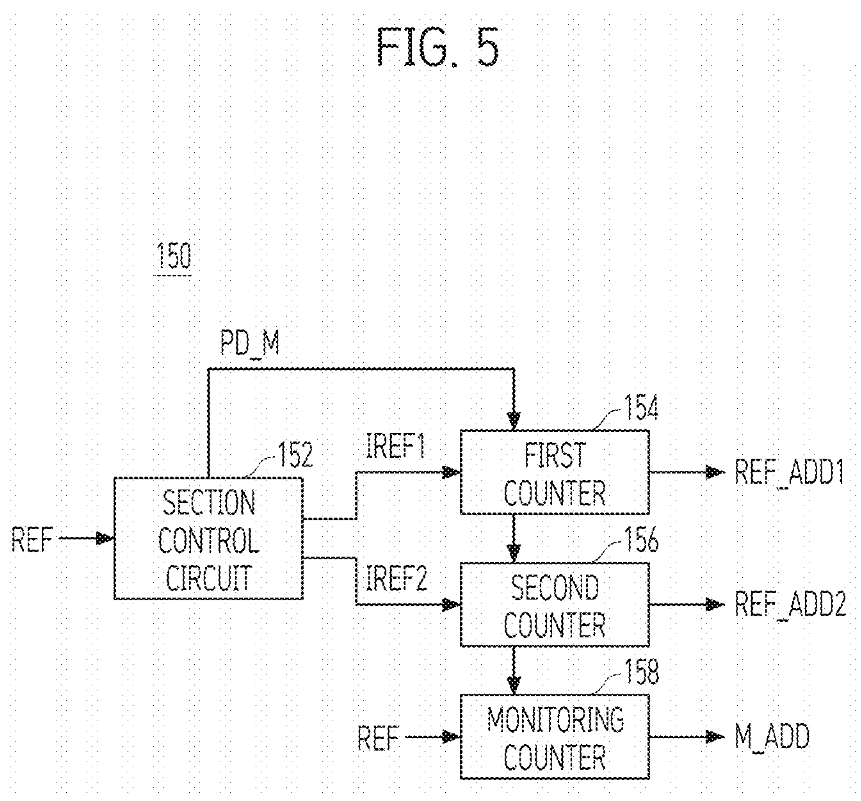
FIG. 5 is a configuration diagram illustrating an address control circuit of FIG. 3.

FIG. 5 is a configuration diagram illustrating the address control circuit 150 of FIG. 3.

Referring to FIG. 5, the address control circuit 150 may include a section control circuit 152, a first counter 154, a second counter 156, and a monitoring counter 158.

The section control circuit 152 may generate, according to the normal refresh command REF, a section signal PD_M that defines the first refresh cycle and the second refresh cycle. For example, the section signal PD_M may have a logic low level during the first refresh cycle and a logic high level during the second refresh cycle. In addition, the section control circuit 152 may generate the first internal refresh signal IREF1 and the second internal refresh signal IREF2, which are activated sequentially according to the normal refresh command REF.

The first counter 154 may generate the first refresh address REF_ADD1, whose start point is determined according to the section signal PD_M and which increases by "+2" from the start point according to the first internal refresh signal IREF1. For example, the first counter 154 may set the start point for designating an odd-numbered row (e.g., a first row) in response to the section signal PD_M of a logic low level and may set the start point for designating an even-numbered row (e.g., a second row) in response to the section signal PD_M of a logic high level.

The second counter 156 may generate the second refresh address REF_ADD2, whose start point is determined according to the start point of the first counter 154 and which increases by "+2" from the start point according to the second internal refresh signal IREF2. For example, the second counter 156 may set the start point by adding "+1" to the start point of the first counter 154.

The monitoring counter 158 may generate the monitoring address M_ADD, whose starting point is determined according to the starting point of the second counter 156 and which increases by "+2" from the starting point according to the refresh command REF. For example, the monitoring counter 158 may set the start point by adding "+1" to the start point of the second counter 156.

According to an embodiment, the monitoring counter 158 may not be included in the address control circuit 150, but may be included in the monitoring circuit 160. That is, the monitoring circuit 160 may receive the second refresh address REF_ADD2 to generate a monitoring address M_ADD continuous from the second refresh address REF_ADD2.

Figure 6:
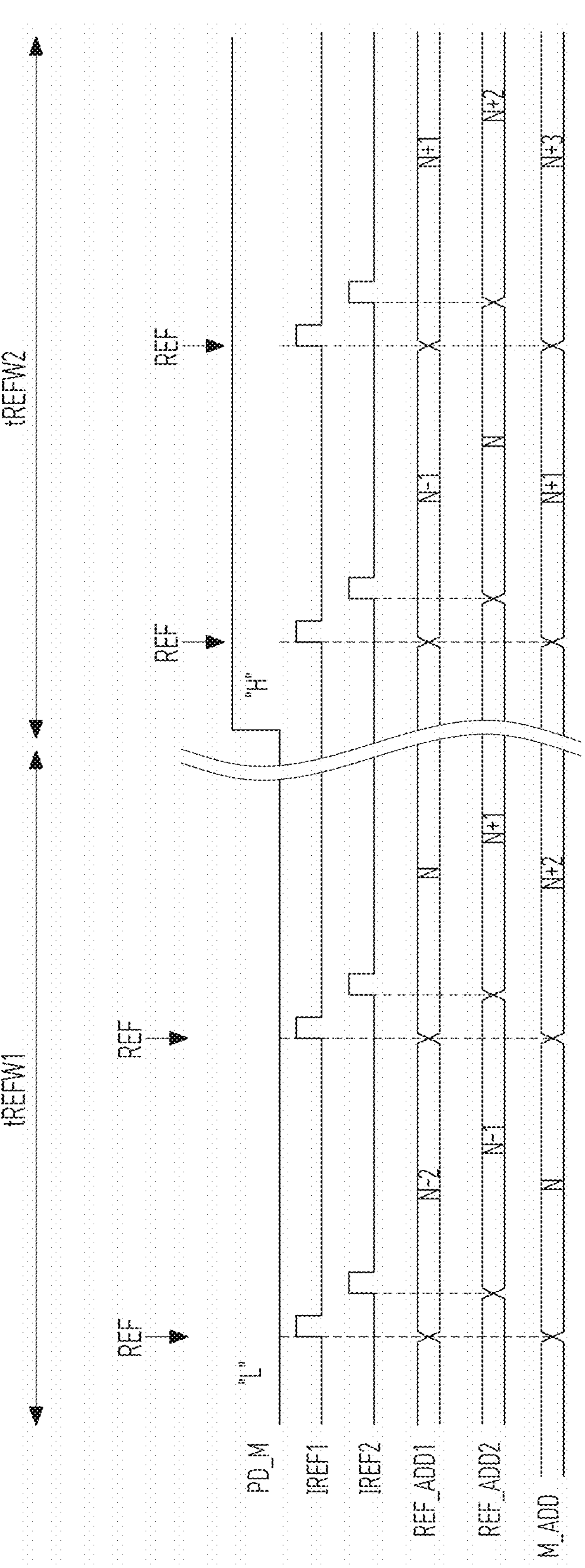
FIG. 6 is a timing diagram for describing an operation of the address control circuit of FIG. 5.

FIG. 6 is a timing diagram for describing an operation of the address control circuit 150 of FIG. 5.

Referring to FIG. 6, the section control circuit 152 may generate the section signal PD_M having a logic low level during the first refresh cycle tREFW1. The section control circuit 152 may sequentially activate the first internal refresh signal IREF1 and the second internal refresh signal IREF2 when the normal refresh command REF is input. Accordingly, the first counter 154 may generate the first refresh address REF_ADD1 that sequentially designates odd-numbered rows, e.g., a (N−2)-th row, an N-th row, etc., where N is an odd number of 3 or more. The second counter 156 may generate the second refresh address REF_ADD2 that sequentially designates even-numbered rows, e.g., a (N−1)-row, a (N+1)-th row, etc. In this case, the monitoring counter 158 may generate the monitoring address M_ADD that sequentially designates the odd-numbered rows, e.g., the N-th row, the (N+2)-th row, etc.

Thereafter, the section control circuit 152 may generate the section signal PD_M of a logic high level during the second refresh cycle tREFW2. The section control circuit 152 may sequentially activate the first internal refresh signal IREF1 and the second internal refresh signal IREF2 when the normal refresh command REF is input. Accordingly, the first counter 154 may generate the first refresh address REF_ADD1 that sequentially designates even-numbered rows, e.g., the (N−1) row, the (N+1) row, etc. The second counter 156 may generate the second refresh address REF_ADD2 that sequentially designates odd-numbered rows, e.g., the N-th row, the (N+2)-th row, etc. In this case, the monitoring counter 158 may generate the monitoring address M_ADD that sequentially designates the even-numbered rows, e.g., the (N+1)-th row, the (N+3)-th row, etc.

Figure 7:
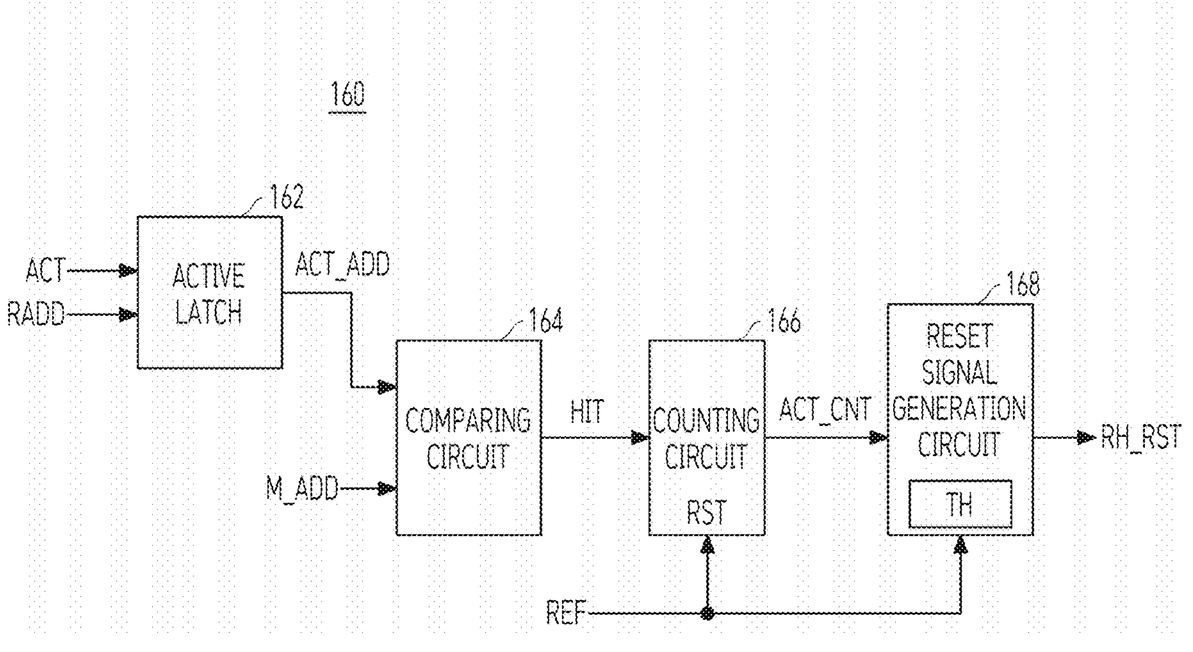
FIG. 7 is a configuration diagram illustrating a monitoring circuit of FIG. 3.

FIG. 7 is a configuration diagram illustrating the monitoring circuit 160 of FIG. 3.

Referring to FIG. 7, the monitoring circuit 160 may include an active latch 162, a comparing circuit 164, a counting circuit 166, and a reset signal generation circuit 168.

The active latch 162 may latch the row address RADD according to the active command ACT to generate an active address ACT_ADD.

The comparing circuit 164 may generate a match signal HIT by comparing the active address ACT_ADD with the monitoring address M_ADD. The comparison circuit 164 may activate the match signal HIT when the comparison result matches.

The counting circuit 166 may be initialized according to the normal refresh command REF and may generate an active counting value ACT_CNT by counting the number of activations of the match signal HIT. That is, the counting circuit 166 may generate the active counting value ACT_CNT by counting the number of activations of the match signal HIT during the refresh interval (tREFI), which is defined by two adjacent normal refresh commands REF.

The reset signal generation circuit 168 may store the active counting value ACT_CNT provided from the counting circuit 166 and may compare the active counting value ACT_CNT with a preset threshold TH according to the normal refresh command REF to generate the row-hammer reset signal RH_RST. The reset signal generation circuit 168 may activate the row-hammer reset signal RH_RST when the active counting value ACT_CNT is less than the preset threshold TH.

Figure 8A:
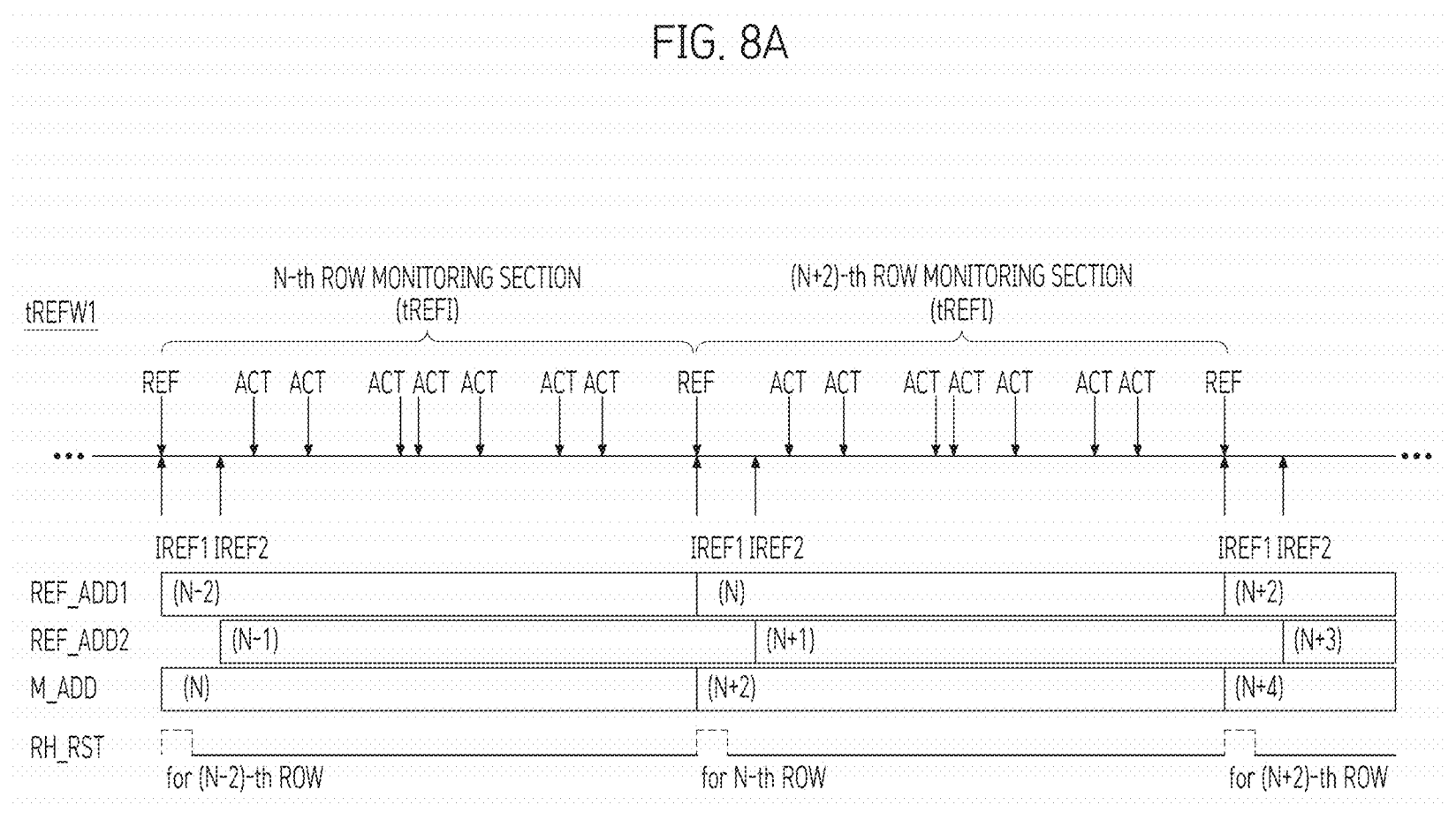

FIGS. 8A and 8B are timing diagrams for describing an operation of the monitoring circuit 160 of FIG. 7.

Referring to FIG. 8A, during the first refresh cycle tREFW1, the address control circuit 150 may generate the first refresh address REF_ADD1 for designating a (N−2)-th row, the second refresh address REF_ADD2 for designating a (N−1)-th row, and the monitoring address M_ADD for designating an N-th row. The row control circuit 120 may sequentially refresh the (N−2)-th row and the (N−1)-th row according to the first internal refresh signal IREF1 and the second internal refresh signal IREF2.

During the refresh interval (tREFI) until the next normal refresh command REF is input, the monitoring circuit 160 may monitor the number of activations of the N-th row corresponding to the monitoring address M_ADD. That is, during the refresh interval (tREFI), the monitoring circuit 160 may increase the active counting value ACT_CNT by "+1" when the monitoring address M_ADD is identical to the row address RADD input with the active command ACT.

When the next normal refresh command REF is input, the address control circuit 150 may generate the first refresh address REF_ADD1 for designating the N-th row, the second refresh address REF_ADD2 for designating a (N+1)-th row, and the monitoring address M_ADD for designating a (N+2)-th row. The row control circuit 120 may sequentially refresh the N-th row and the (N+1)-th row according to the first internal refresh signal IREF1 and the second internal refresh signal IREF2. At this time, the monitoring circuit 160 may compare the active counting value ACT_CNT with the preset threshold to activate the row-hammer reset signal RH_RST when the active counting value ACT_CNT is less than the preset threshold. Accordingly, during the refresh operation of the N-th row, the row-hammer cells coupled to the N-th row may be selectively initialized.

Referring to FIG. 8B, during the second refresh cycle tREFW2, the address control circuit 150 may generate the first refresh address REF_ADD1 for designating the (N−1)-th row, the second refresh address REF_ADD2 for designating the N-th row, and the monitoring address M_ADD for designating the (N+1)-th row. The row control circuit 120 may sequentially refresh the (N−1)-th row and the N-th row according to the first internal refresh signal IREF1 and the second internal refresh signal IREF2.

During the refresh interval (tREFI) until the next normal refresh command REF is input, the monitoring circuit 160 may monitor the number of activations of the (N+1)-th row corresponding to the monitoring address M_ADD. That is, during the refresh interval (tREFI), the monitoring circuit 160 may increase the active counting value ACT_CNT by "+1" when the monitoring address M_ADD is identical to the row address RADD input with the active command ACT.

When the next normal refresh command REF is input, the address control circuit 150 may generate the first refresh address REF_ADD1 for designating the (N+1)-th row, the second refresh address REF_ADD2 for designating a (N+2)-th row, and the monitoring address M_ADD for designating a (N+3)-th row. The row control circuit 120 may sequentially refresh the (N+1)-th row and the (N+2)-th row according to the first internal refresh signal IREF1 and the second internal refresh signal IREF2. At this time, the monitoring circuit 160 may compare the active counting value ACT_CNT with the preset threshold to activate the row-hammer reset signal RH_RST when the active counting value ACT_CNT is less than the preset threshold. Accordingly, during the refresh operation of the (N+1)-th row, the row-hammer cells coupled to the (N+1)-th row may be selectively initialized.

Hereinafter, referring to the drawings, an operation of a memory device according to an embodiment of the present invention will be described.

Figure 9:
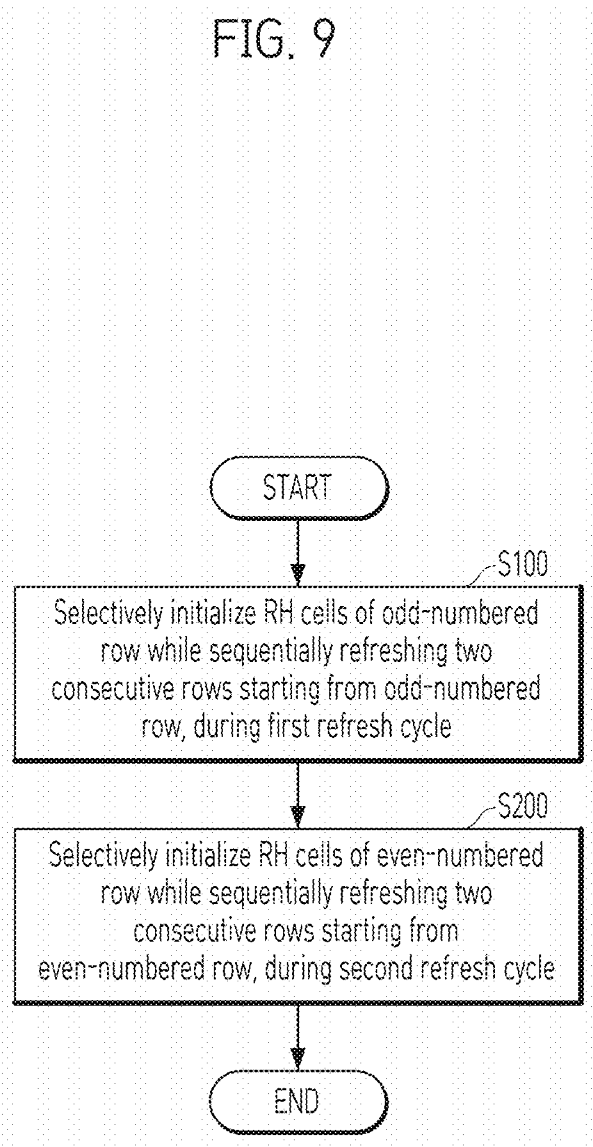
FIG. 9 is a flowchart for describing an operation of a memory device according to an embodiment of the present invention.
Figure 10A:
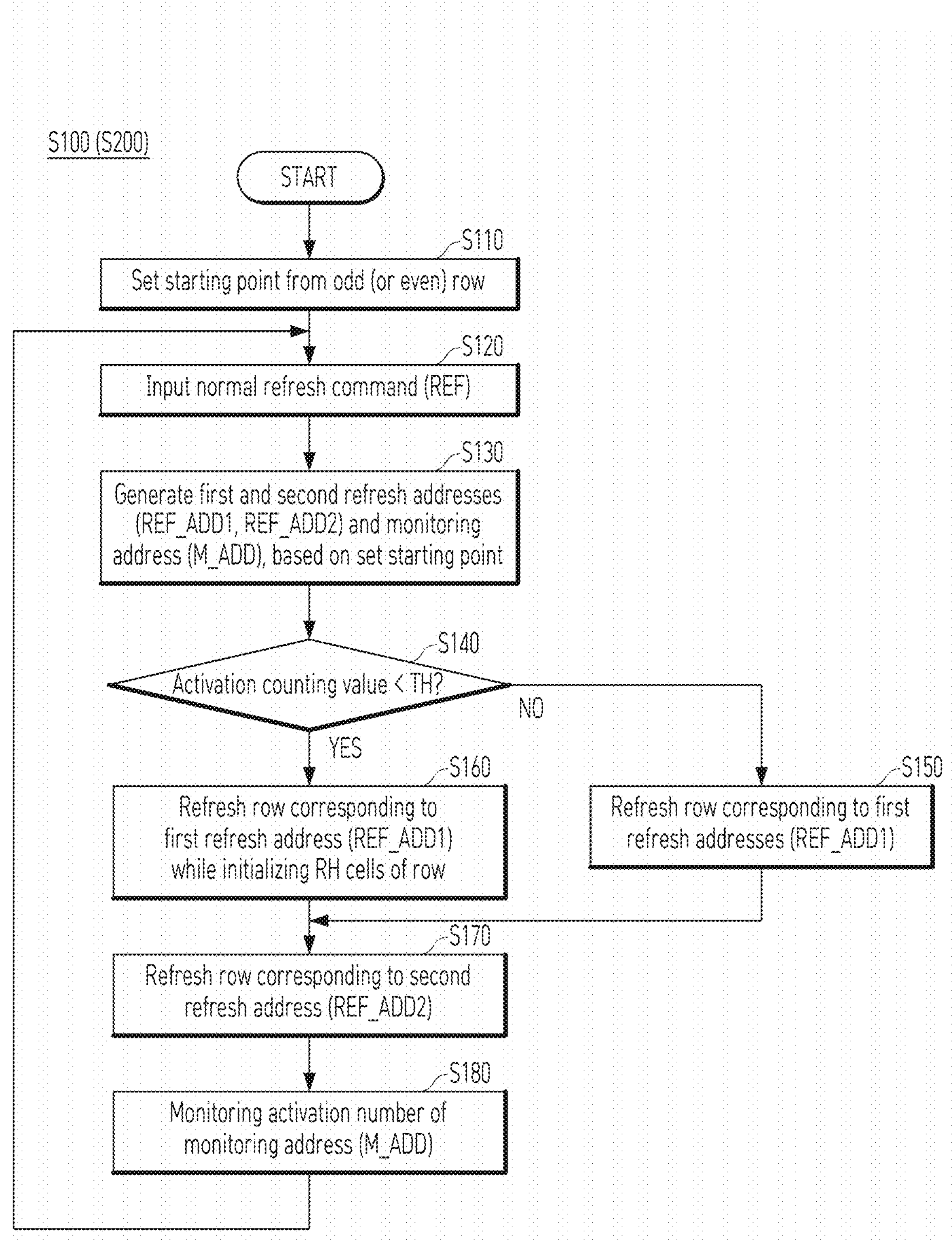
FIGS. 10A and 10B are flowcharts for describing each operation of FIG. 9 in detail.
Figure 10B:
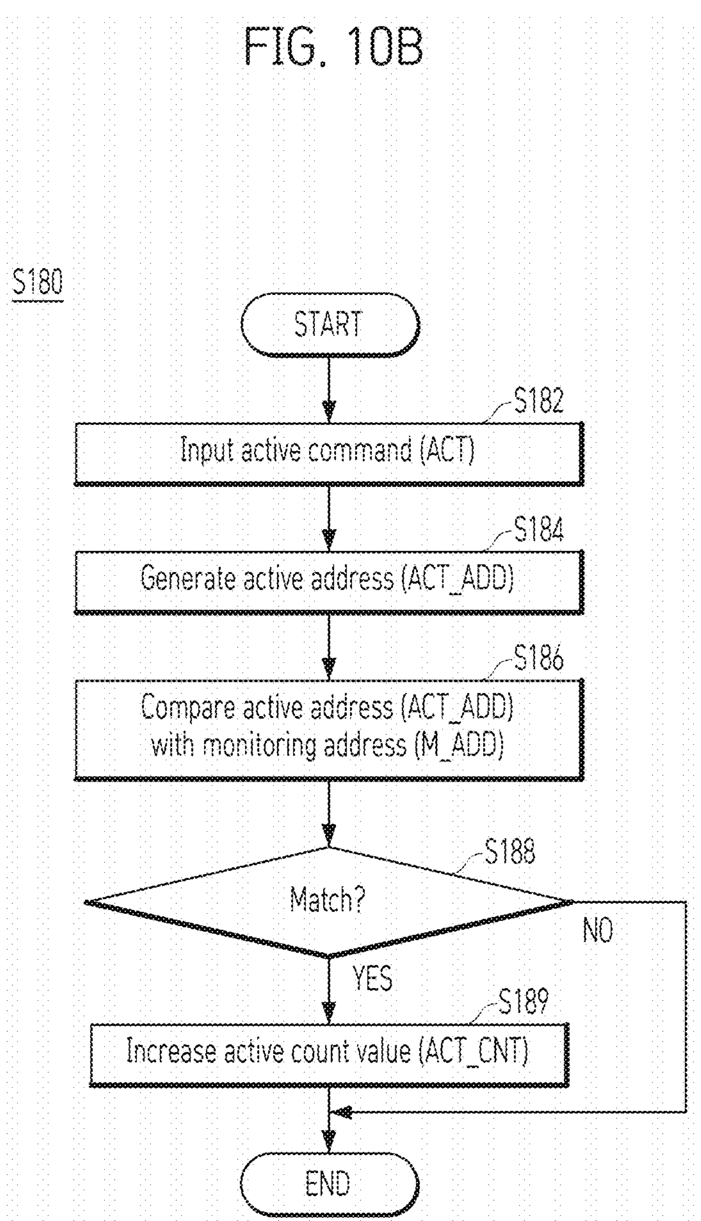

FIGS. 9 to 10B are flowcharts for describing an operation of the memory device 100 according to an embodiment of the present invention.

Referring to FIG. 9, during the first refresh cycle tREFW1, the memory device 100 may repeatedly perform, according to the normal refresh command REF, an operation of sequentially refreshing two consecutive rows starting from the odd-numbered row while selectively initializing row-hammer cells of an odd-numbered row (at S100).

Thereafter, during the second refresh cycle tREFW2, the memory device 100 may repeatedly perform, according to the normal refresh command REF, an operation of sequentially refreshing two consecutive rows starting from the even-numbered row while selectively initializing row-hammer cells of an even-numbered row (at S200).

In more detail, FIGS. 10A and 10B show the operation S100 during the first refresh cycle tREFW1.

Referring to FIG. 10A, a start point (i.e., the start point of the first counter 154) may be set for designating an odd-numbered row in response to the section signal PD_M of a logic low level during the first refresh cycle tREFW1 (at S110). When the normal refresh command REF is inputted (at S120), the first refresh address REF_ADD1 (i.e., the start point), the second refresh address REF_ADD2, and the monitoring address M_ADD, which are consecutive may be generated (at S130).

At this time, when the active counting value ACT_CNT of the monitoring row, which corresponds to the previously generated monitoring address M_ADD and therefore currently the first refresh address REF_ADD1, is greater than or equal to the threshold TH ("NO" in S140), the memory device 100 may refresh a row corresponding to the first refresh address REF_ADD1 without initializing the row-hammer cells (at S150). On the other hand, when the active counting value ACT_CNT of the monitoring row is less than the threshold TH ("YES" in S140), the row-hammer reset signal RH_RST may be activated. Accordingly, the memory device 100 may refresh a row corresponding to the first refresh address REF_ADD1 while initializing the row-hammer cells coupled to the corresponding row according to the activated row-hammer reset signal RH_RST (at S160). Thereafter, a row corresponding to the second refresh address REF_ADD2 may be refreshed (at S170).

Thereafter, during the refresh interval (tREFI), the active counting value ACT_CNT may be generated by monitoring the activation number of the monitoring row corresponding to the currently generated monitoring address M_ADD (at S180). More specifically, referring to FIG. 10B, when the active command ACT is input (at S182), the active address ACT_ADD may be generated by latching the row address RADD (at S184). The active address ACT_ADD is compared to the monitoring address M_ADD (at S186). When the comparison result matches ("YES" in S188), the active counting value ACT_CNT may be increased (at S189). In this way, during the refresh interval (tREFI), the active counting value ACT_CNT may be generated by counting the number of activations of the monitoring row.

Referring to FIG. 10A, when the normal refresh command REF is input again (at S120), the first refresh address REF_ADD1, the second refresh address REF_ADD2, and the monitoring address M_ADD may be generated by being increased by "+2" (at S130). The operations S120 to 180 may be repeatedly performed during the first refresh cycle tREFW1.

The operation S200 during the second refresh cycle tREFW2 is substantially the same as the operation S100, except for the operation of setting the starting point at S110. That is, during the second refresh cycle tREFW2, the start point (i.e., a start point of the first counter 154) may be set for designating an even-numbered row in response to the section signal PD_M of a logic high level (at S110). The operations S120 to 180 may be repeatedly performed during the second refresh cycle tREFW2.

As described above, in an embodiment of the present invention, the odd-numbered rows are selectively initialized during the first refresh cycle, and the even-numbered rows are selectively initialized during the second refresh cycle, so that the row-hammer cells of all rows may be initialized during the first and second refresh cycles. Therefore, it is possible to initialize the row-hammer cells without checking the counting data stored in the row-hammer cells, thereby minimizing the power consumption while maintaining the row-hammer attack defense capability.

In the above embodiment, two consecutive rows are continuously refreshed according to one normal refresh command REF, but the proposed invention is not limited thereto.

Figure 11:
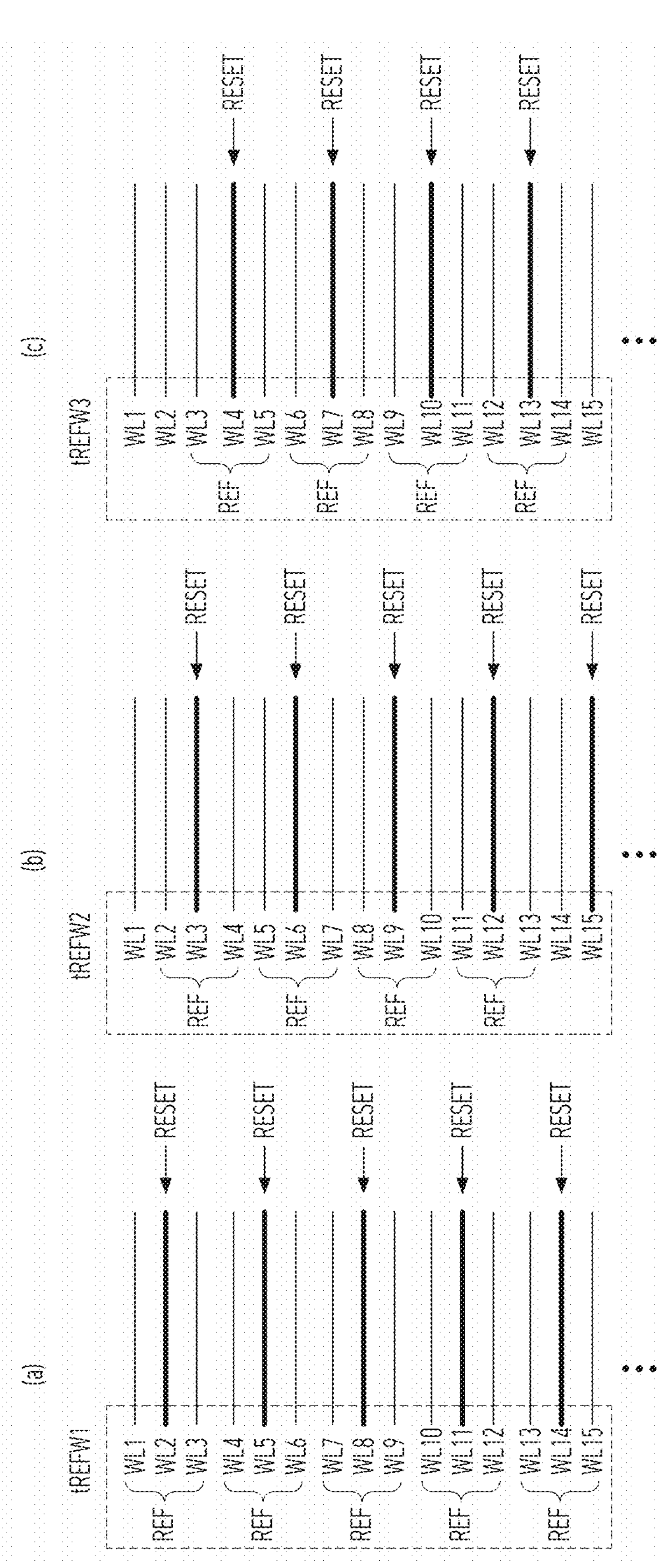
FIG. 11 is a diagram for describing an operation of a memory device according to a modified embodiment of the present invention.

FIG. 11 is a diagram for describing an operation of the memory device 100 according to a modified embodiment of the present invention. FIG. 11 illustrates a case where three consecutive rows are continuously refreshed according to one normal refresh command REF.

Referring to (a) of FIG. 11, an address control circuit may generate, whenever a normal refresh command REF is input during a first refresh cycle tREFW1, first to third refresh addresses REF_ADD1 to REF_ADD3 for sequentially designating three consecutive rows, e.g., a (3k−2)-th row to a 3k-th row, where "k" is an integer greater than or equal to 1. A refresh control circuit may sequentially refresh the (3k−2)-th row to the 3k-th row according to the normal refresh command REF. In this case, the refresh control circuit may initialize the row-hammer cells of the (3k−1)-th row while refreshing the (3k−1)-th row specified by the second refresh address REF_ADD2.

Referring to (b) of FIG. 11, the address control circuit may generate, whenever the normal refresh command REF is input during a second refresh cycle tREFW2, the first to third refresh addresses REF_ADD1 to REF_ADD3 for sequentially designating three consecutive rows, e.g., a (3k−1)-th row to a (3k+1)-th row. The refresh control circuit may sequentially refresh the (3k−1)-th row to the (3k+1)-th row according to the normal refresh command REF. In this case, the refresh control circuit may initialize the row-hammer cells of the 3K-th row while refreshing the 3K-th row specified by the second refresh address REF_ADD2.

Referring to (c) of FIG. 11, the address control circuit may generate, whenever the normal refresh command REF is input during a third refresh cycle tREFW3, the first to third refresh addresses REF_ADD1 to REF_ADD3 for sequentially designating three consecutive rows, e.g., a 3k-th row to a (3k+2)-th row. The refresh control circuit may sequentially refresh the 3k-th row to the (3k+2)-th row according to the normal refresh command REF. In this case, the refresh control circuit may initialize the row-hammer cells of the (3K+1)-th row while refreshing the (3K+1)-th row specified by the second refresh address REF_ADD2.

The first to third refresh addresses REF_ADD1 to REF_ADD3 may be repeatedly generated during each of the first refresh cycle tREFW1 to the third refresh cycle tREFW3 within a refresh window (tREFW) set to refresh all rows. As described above, the row-hammer cells of the (3k−1)-th row are initialized during the first refresh cycle, the row-hammer cells of the 3k-th row are initialized during the second refresh cycle, and the row-hammer cells of the (3k+1)-th row are initialized during the third refresh cycle, so that the row-hammer cells of all rows may be initialized during the first to third refresh cycles.

As described above, in the embodiment of the present invention, since three consecutive rows are refreshed according to the normal refresh command REF, adjacent rows (i.e., a (m−1)-th row and a (m+1)-th row) may be immediately refreshed even if the row-hammer cells of a specific m-th row are initialized without monitoring the number of activations, thereby minimizing the possibility of damage caused by the row-hammer.

Depending on a mode setting in the specification, a (m−1)-th row and a (m+1)-th row, which are the closest rows to an m-th row, may always be refreshed during a target refresh operation, and a (m−2)-th row and a (m+2)-th row, which are the next closest rows, may be refreshed at a reduced refresh rate. For example, when the refresh rate is set to 0.25, the next closest rows may be refreshed once each time the closest rows are refreshed four times.

Hereinafter, in an embodiment of the present invention, a method of initializing row-hammer cells when refreshing both the closest rows and the next closest rows during a target refresh operation, will be described.

FIG. 12 is a block diagram illustrating a memory device 200 according to another embodiment of the present invention.

Referring to FIG. 12, the memory device 200 may include a memory cell region 210, a row control circuit 220, a column control circuit 230, a row-hammer management circuit 240, an address control circuit 250, a monitoring circuit 260, a command/address (CA) buffer 272, a command decoder 273, an address generation circuit 274, an internal signal generation circuit 275, and a data input/output circuit 280. The memory cell region 210, the column control circuit 230, the row-hammer management circuit 240, the CA buffer 272, the command decoder 273, the address generation circuit 274, the internal signal generation circuit 275, and the data input/output circuit 280 of FIG. 12 may have substantially the same configurations as the components of the memory device 100 of FIG. 3.

The row control circuit 220 may be coupled to a plurality of normal cells MC in a normal cell region 212 and a plurality of row-hammer cells RHC in a row-hammer cell region 214, through a plurality of rows WL. The row control circuit 220 may select or activate at least one row selected by a row address RADD when an active command ACT is input and deactivate the activated row when a precharge command PCG is input. During a normal refresh operation, the row control circuit 220 may sequentially refresh the plurality of rows WL. In an embodiment of the present invention, when one refresh command REF is input during a normal refresh operation, the row control circuit 220 may refresh four consecutive rows. The row control circuit 220 may refresh a row corresponding to a first refresh address REF_ADD1 according to a first internal refresh signal IREF1, may refresh a row corresponding to a second refresh address REF_ADD2 according to a second internal refresh signal IREF2, may refresh a row corresponding to a third refresh address REF_ADD3 according to a third internal refresh signal IREF3 and may refresh a row corresponding to a fourth refresh address REF_ADD4 according to a fourth internal refresh signal IREF4.

The address control circuit 250 may generate, according to the normal refresh command REF, the first refresh address REF_ADD1, the second refresh address REF_ADD2, the third refresh address REF_ADD3, the fourth refresh address REF_ADD4, a first monitoring address M_ADD1, and a second monitoring address M_ADD2, which have consecutive values. The address control circuit 250 may generate the first refresh address REF_ADD1 to start with a value designating an n-th row, where "n" is an integer greater than 1, during a first refresh cycle, and to start with a value designating a (n+2)-th row during a second refresh cycle. The first to fourth refresh addresses REF_ADD1 to REF_ADD4 and the first and second monitoring addresses M_ADD1 and M_ADD2 may be repeatedly generated during each of the first refresh cycle and the second refresh cycle within a refresh window (REFW) set to refresh all rows.

The address control circuit 250 may increase each value of the first refresh address REF_ADD1, the second refresh address REF_ADD2, the third refresh address REF_ADD3, the fourth refresh address REF_ADD4, a first monitoring address M_ADD1 by "+4" each time the normal refresh command REF is input. The address control circuit 250 may sequentially activate the first to fourth internal refresh signals IREF1 to IREF4 according to the normal refresh command REF. The address control circuit 250 may generate the first refresh address REF_ADD1 in synchronization with the first internal refresh signal IREF1, generate the second refresh address REF_ADD2 in synchronization with the second internal refresh signal IREF2, generate the third refresh address REF_ADD3 in synchronization with the third internal refresh signal IREF3, and generate the fourth refresh address REF_ADD4 in synchronization with the fourth internal refresh signal IREF4. A detailed configuration and operation of the address control circuit 250 will be described with reference to FIGS. 13 and 14.

The monitoring circuit 260 may generate a row-hammer reset signal RH_RST by monitoring the number of activations of a first monitoring row corresponding to the first monitoring address M_ADD1 and the number of activations of a second monitoring row corresponding to the second monitoring address M_ADD2 during a refresh interval (tREFI) defined by two adjacent normal refresh commands REF. For example, the monitoring circuit 260 may increase a first active counting value (ACT_CNT1 of FIG. 15) when the row address RADD input with the active command ACT is identical to the first monitoring address M_ADD1, and increase a second active counting value (ACT_CNT2 of FIG. 15) when the row address RADD input with the active command ACT is identical to the second monitoring address M_ADD2. According to the normal refresh command REF, the monitoring circuit 260 may compare the first active counting value ACT_CNT1 with a preset first threshold and compare the second active counting value ACT_CNT2 with a preset second threshold. Preferably, the second threshold may be set to a smaller number than the first threshold. The monitoring circuit 260 may activate the row-hammer reset signal RH_RST up to two times according to the comparison result. A detailed configuration and operation of the monitoring circuit 260 will be described with reference to FIG. 15.

In the above embodiment, in case where the next closest rows are set to (m±2)-th rows, four rows are refreshed according to one normal refresh command REF, but the proposed invention is not limited thereto. Depending on the embodiment, when the next closest rows are set to (m±k)-th rows, 2k rows may be refreshed according to one normal refresh command REF. In this case, "k" may be determined based on the number of the next closest rows to be refreshed during a target refresh operation.

Figure 13:
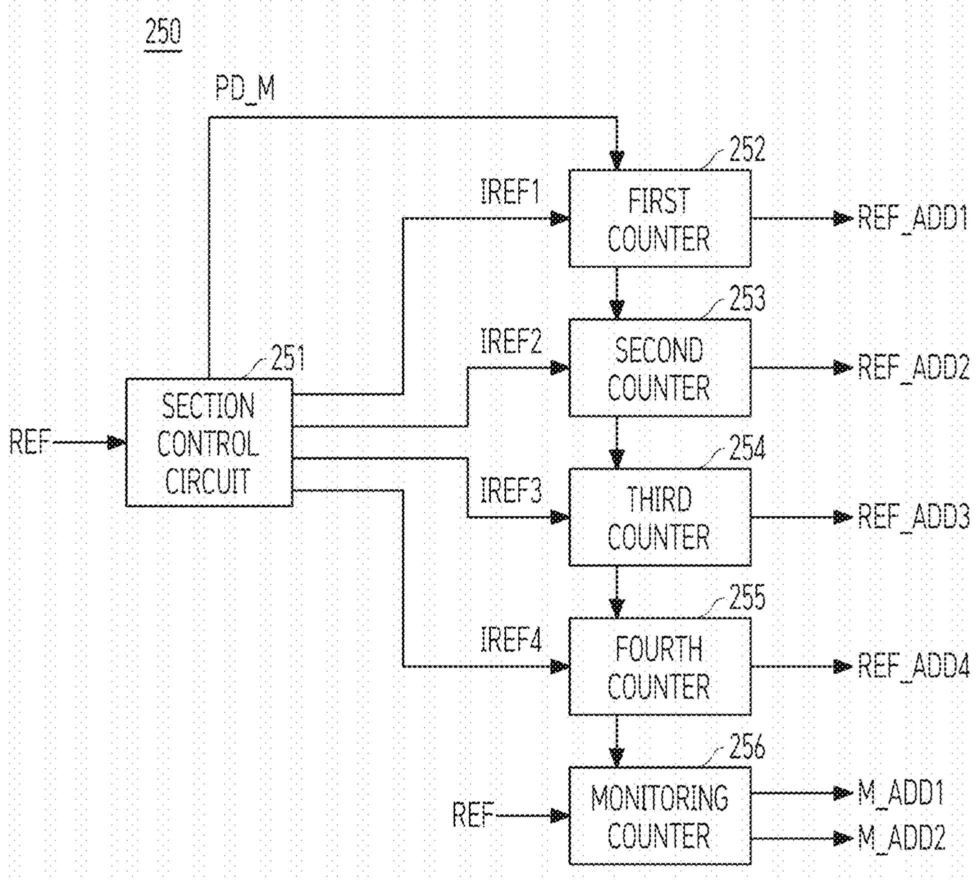
FIG. 13 is a configuration diagram illustrating an address control circuit of FIG. 12.

FIG. 13 is a configuration diagram illustrating the address control circuit 250 of FIG. 12.

Referring to FIG. 13, the address control circuit 250 may include a section control circuit 251, a first counter 252, a second counter 253, a third counter 254, a fourth counter 255, and a monitoring counter 256.

The section control circuit 251 may generate, according to the normal refresh command REF, a section signal PD_M that defines the first refresh cycle and the second refresh cycle. The section control circuit 251 may generate the first to fourth internal refresh signals IREF1 to IREF4, which are activated sequentially according to the normal refresh command REF.

The first counter 252 may generate the first refresh address REF_ADD1, whose start point is determined according to the section signal PD_M and which increases by "+4" from the start point according to the first internal refresh signal IREF1. For example, the first counter 252 may set the start point for designating an n-th row (e.g., a first row) in response to the section signal PD_M of a logic low level and may set the start point for designating a (n+2)-th row (e.g., a third row) in response to the section signal PD_M of a logic high level.

The second counter 253 may generate the second refresh address REF_ADD2, whose start point is determined according to the start point of the first counter 252 and which increases by "+4" from the start point according to the second internal refresh signal IREF2.

The third counter 254 may generate the third refresh address REF_ADD3, whose start point is determined according to the start point of the second counter 253 and which increases by "+4" from the start point according to the third internal refresh signal IREF3.

The fourth counter 255 may generate the fourth refresh address REF_ADD4, whose start point is determined according to the start point of the third counter 254 and which increases by "+4" from the start point according to the fourth internal refresh signal IREF4.

The monitoring counter 256 may generate the first monitoring address M_ADD1, whose starting point is determined according to the starting point of the fourth counter 255 and which increases by "+4" from the starting point according to the refresh command REF. The monitoring counter 256 may generate the second monitoring address M_ADD2 by increasing the first monitoring address M_ADD1 by "+1".

Figure 14:
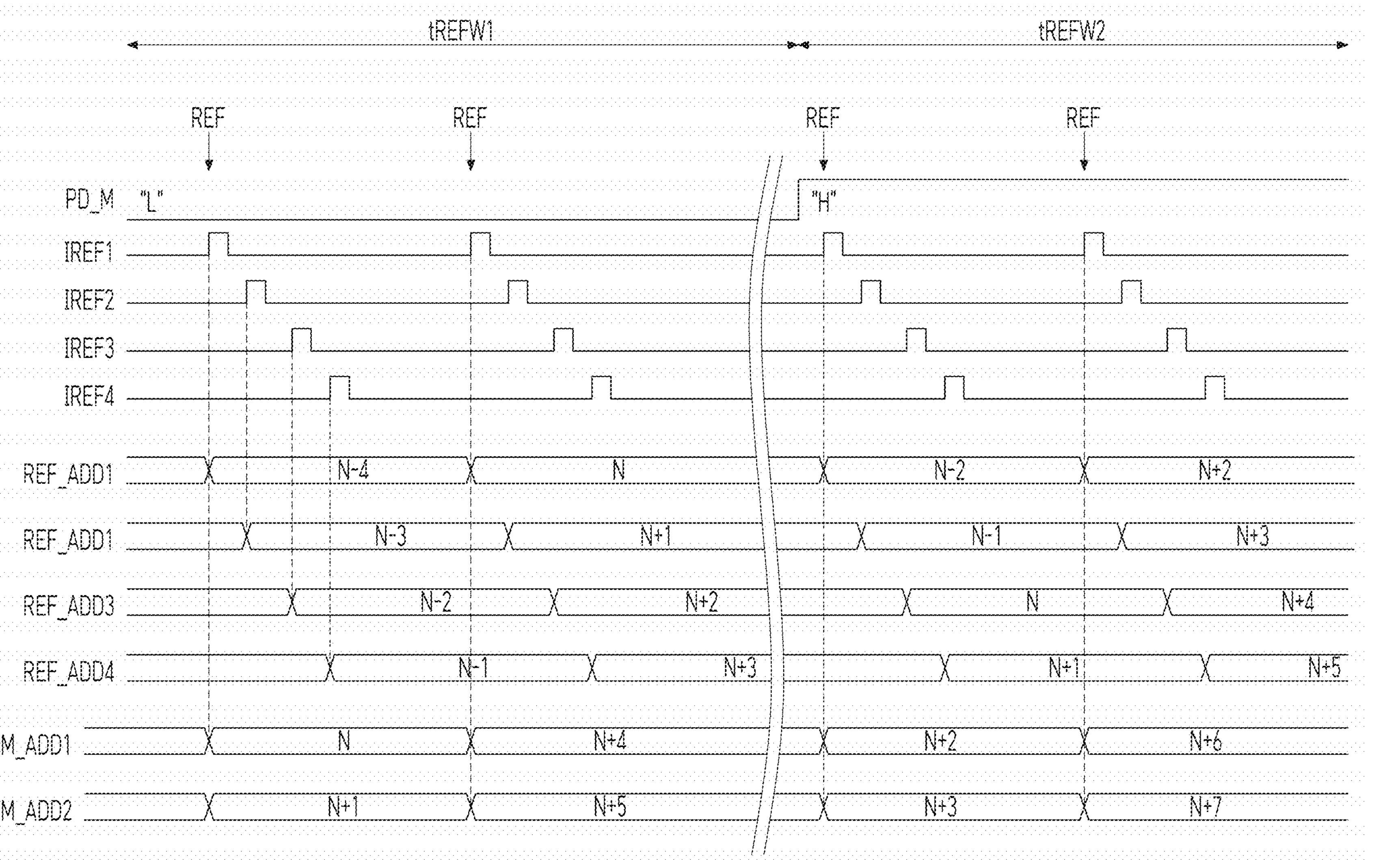
FIG. 14 is a timing diagram for describing an operation of the address control circuit of FIG. 13.

FIG. 14 is a timing diagram for describing an operation of the address control circuit 250 of FIG. 13.

Referring to FIG. 14, the section control circuit 251 may generate the section signal PD_M having a logic low level during a first refresh cycle tREFW1. The section control circuit 251 may sequentially activate the first to fourth internal refresh signals IREF1 to IREF4 when the normal refresh command REF is input. The first to fourth counters 252 to 255 may generate the first to fourth refresh addresses REF_ADD1 to REF_ADD4 for designating four consecutive rows, e.g., a (N−4)-th row to a (N−1)-th row. The monitoring counter 256 may generate the first monitoring address M_ADD1 and the second monitoring address M_ADD2, which designate consecutive rows, e.g., an N-th row and a (N+1)-th row. Thereafter, when the normal refresh command REF is input, the first to fourth counters 252 to 255 may generate the first refresh addresses REF_ADD1 to REF_ADD4 that increase by "+4", and the monitoring counter 256 may generate the first monitoring addresses M_ADD1 and the second monitoring addresses M_ADD2 that increase by "+4".

The section control circuit 251 may generate the section signal PD_M having a logic high level during a second refresh cycle tREFW2. The section control circuit 251 may sequentially activate the first to fourth internal refresh signals IREF1 to IREF4 when the normal refresh command REF is input. The first to fourth counters 252 to 255 may generate the first to fourth refresh addresses REF_ADD1 to REF_ADD4 for designating four consecutive rows, e.g., the (N−2)-th row to the (N+1)-th row. The monitoring counter 256 may generate the first monitoring address M_ADD1 and the second monitoring address M_ADD2, which designate consecutive rows, e.g., the (N+2)-th row and the (N+3)-th row. Thereafter, when the normal refresh command REF is input, the first to fourth counters 252 to 255 may generate the first refresh addresses REF_ADD1 to REF_ADD4 that increase by "+4", and the monitoring counter 256 may generate the first monitoring addresses M_ADD1 and the second monitoring addresses M_ADD2 that increase by "+4".

Figure 15:
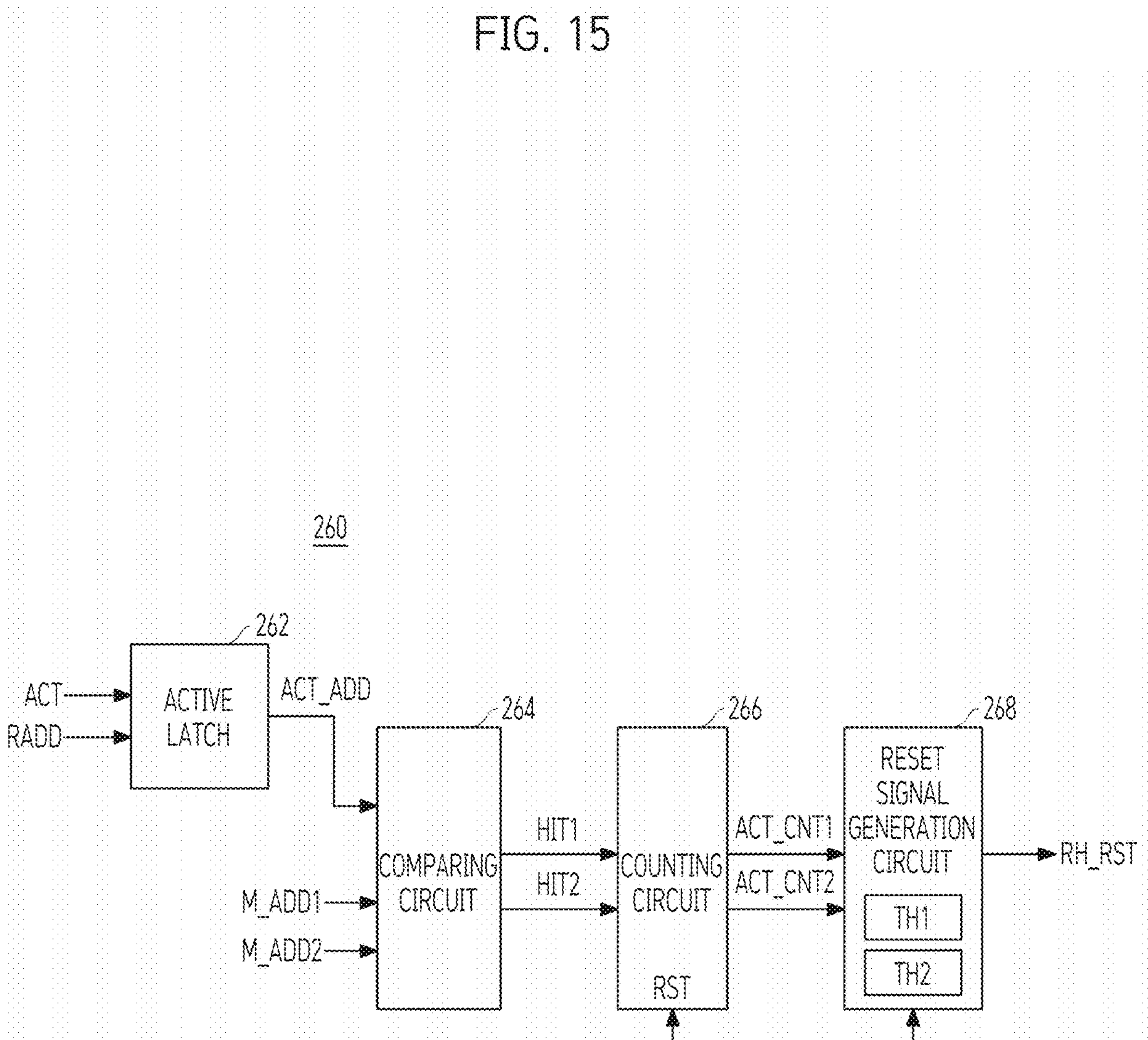
FIG. 15 is a configuration diagram illustrating a monitoring circuit of FIG. 12.

FIG. 15 is a configuration diagram illustrating the monitoring circuit 260 of FIG. 12.

Referring to FIG. 15, the monitoring circuit 260 may include an active latch 262, a comparing circuit 264, a counting circuit 266, and a reset signal generation circuit 268.

The active latch 262 may latch the row address RADD according to the active command ACT to generate an active address ACT_ADD.

The comparing circuit 264 may generate a first match signal HIT1 by comparing the active address ACT_ADD with the first monitoring address M_ADD1, and a second match signal HIT2 by comparing the active address ACT_ADD with the second monitoring address M_ADD2. The comparison circuit 164 may activate the match signal HIT when the comparison result matches.

The counting circuit 266 may be initialized according to the normal refresh command REF and may generate a first active counting value ACT_CNT1 by counting the number of activations of the first match signal HIT1, and a second active counting value ACT_CNT2 by counting the number of activations of the second match signal HIT2.

According to the normal refresh command REF, the reset signal generation circuit 268 may compare the first active counting value ACT_CNT1 with a preset first threshold TH1 and may compare the second active counting value ACT_CNT2 with a preset second threshold TH2 to generate the row-hammer reset signal RH_RST. The reset signal generation circuit 168 may activate the row-hammer reset signal RH_RST up to two times.

Figure 16B:
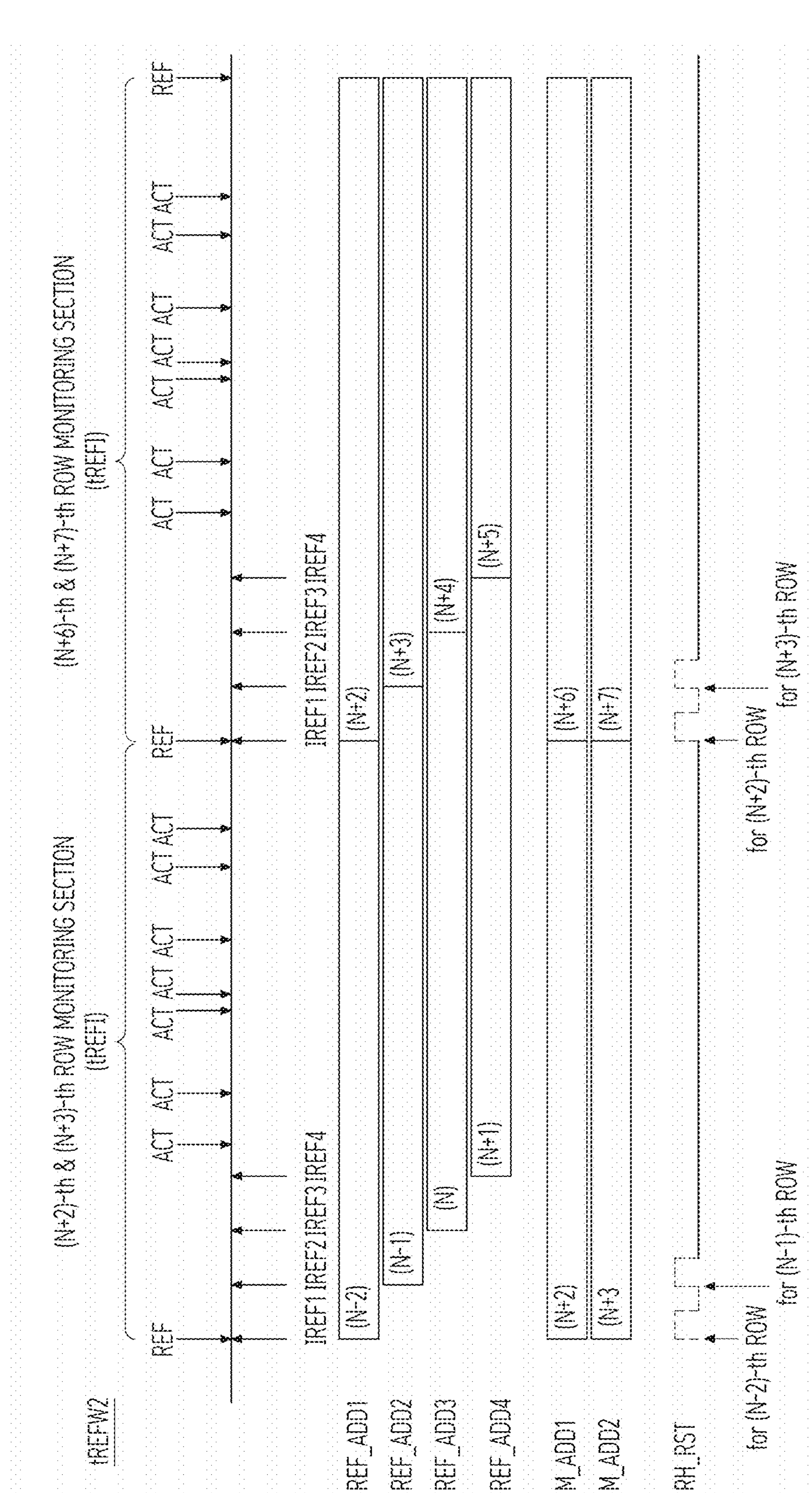

FIGS. 16A and 16B are timing diagrams for describing an operation of the monitoring circuit 260 of FIG. 15.

Referring to FIG. 16A, during a first refresh cycle tREFW1, the address control circuit 250 may generate the first to fourth refresh addresses REF_ADD1 to REF_ADD4 for designating consecutive (N−4)-th to (N−1)-th rows and may generate the first and second monitoring addresses M_ADD1 and M_ADD2 for designating a consecutive N-th row and a (N+1)-th row. The row control circuit 220 may sequentially refresh (N−4)-th to (N−1)-th rows according to the first to fourth internal refresh signals IREF1 to IREF4.

The monitoring circuit 260 may respectively monitor the number of activations of the N-th row and the (N+1)-th row corresponding to the first and second monitoring addresses M_ADD1 and M_ADD2 during the refresh interval (tREFI) until the next normal refresh command REF is input. That is, the monitoring circuit 260 may generate, during the refresh interval (tREFI), the first active counting value ACT_CNT1 and the second active counting value ACT_CNT2 by respectively comparing the row address RADD input together with the active command ACT with the first and second monitoring addresses M_ADD1 and M_ADD2.

When the next normal refresh command REF is input, the address control circuit 250 may generate the first to fourth refresh addresses REF_ADD1 to REF_ADD4 for designating consecutive N-th to (N+3)-th rows, and generate the first and second monitoring addresses M_ADD1 and M_ADD2 for designating consecutive a (N+4)-th row and a (N+5)-th row. The row control circuit 220 may sequentially refresh the N-th to (N+3)-th rows according to the first to fourth internal refresh signals IREF1 to IREF4.

At this time, the monitoring circuit 260 may activate the row-hammer reset signal RH_RST once, when the first active counting value ACT_CNT1 is less than the first threshold TH1. Depending on an embodiment, the monitoring circuit 260 may activate the row-hammer reset signal RH_RST to be synchronized with the first internal refresh signal IREF1. Accordingly, during the refresh operation of the N-th row, the row-hammer cells of the N-th row may be selectively initialized. In addition, the monitoring circuit 260 may activate the row-hammer reset signal RH_RST once more when the second active counting value ACT_CNT2 is less than the second threshold TH2. Depending on an embodiment, the monitoring circuit 260 may activate the row-hammer reset signal RH_RST to be synchronized with the second internal refresh signal IREF2. Accordingly, during the refresh operation of the (N+1)-th row, the row-hammer cells of the (N+1)-th row may be selectively initialized.

Referring to FIG. 16B, during a second refresh cycle tREFW2, the address control circuit 250 may generate the first to fourth refresh addresses REF_ADD1 to REF_ADD4 for designating consecutive (N−2)-th to (N+1)-th rows, and generate the first and second monitoring addresses M_ADD1 and M_ADD2 for designating a consecutive (N+2)-th row and (N+3)-th row. The row control circuit 220 may sequentially refresh the (N−2)-th to (N+1)-th rows according to the first to fourth internal refresh signals IREF1 to IREF4.

The monitoring circuit 260 may generate, during the refresh interval (tREFI) until the next normal refresh command REF is input, the first active counting value ACT_CNT1 and the second active counting value ACT_CNT2 by respectively monitoring the number of activations of the (N+2)-th row and the (N+3)-th row.

When the next normal refresh command REF is input, the address control circuit 250 may generate the first to fourth refresh addresses REF_ADD1 to REF_ADD4 for designating consecutive (N+2)-th to (N+5)-th rows, and generate the first and second monitoring addresses M_ADD1 and M_ADD2 for designating a consecutive (N+6)-th row and (N+7)-th row. The row control circuit 220 may sequentially refresh the (N+2)-th to (N+5)-th rows according to the first to fourth internal refresh signals IREF1 to IREF4.

At this time, the monitoring circuit 260 may activate the row-hammer reset signal RH_RST once when the first active counting value ACT_CNT1 is less than the first threshold TH1, and thus, the row-hammer cells of the (N+2)-th row may be selectively initialized during the refresh operation of the N-th row. In addition, the monitoring circuit 260 may activate the row-hammer reset signal RH_RST once more when the second active counting value ACT_CNT2 is less than the second threshold TH2, and thus, the row-hammer cells of the (N+3)-th row may be selectively initialized during the refresh operation of the (N+3)-th row.

As described above, in accordance with the embodiment of the present invention, even in a scheme in which both of the closest and the next closest rows are refreshed depending on the refresh rate, the row-hammer cells of all rows may be initialized according to the normal refresh command REF during the first and second refresh cycles. Therefore, it is possible to initialize the row-hammer cells without checking the counting data stored in the row-hammer cells, thereby minimizing the power consumption while maintaining the row-hammer attack defense capability.

Figure 17:
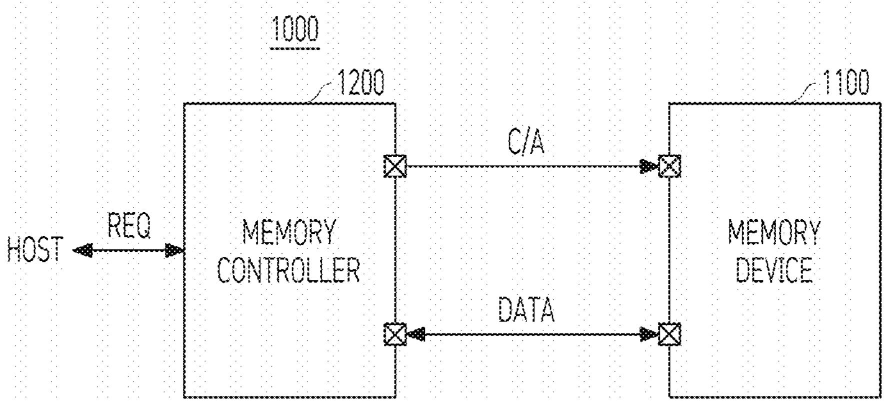
FIG. 17 is a block diagram illustrating a memory system according to an embodiment of the present invention.

FIG. 17 is a block diagram illustrating a memory system 1000 according to an embodiment of the present invention.

Referring to FIG. 17, the memory system 1000 include a memory device 1100 and a memory controller 1200.

The memory controller 1200 may control an overall operation of the memory system 1000 and control an overall data exchange between a host and the memory device 1100. The memory controller 1200 may generate a command/address signal (C/A) in response to a request REQ from the host and provide it to the memory device 1100. According to an embodiment, the memory controller 1200 may provide a clock to the memory device 1100 together with the command/address signal C/A. The memory controller 1200 may provide data DATA corresponding to the request REQ provided from the host to the memory device 1100. The memory controller 1200 may provide the data DATA read from the memory device 1100 to the host.

The command/address signal C/A provided by the memory controller 1200 to the memory device 1100 may include an active command ACT, a precharge command PCG, a normal refresh command REF, a refresh management command, a read command RD, and a write command WT. The memory controller 1200 may apply the normal refresh command REF indicating a normal refresh operation between operations requested by the host. The memory controller 1200 may apply the normal refresh command REF so that all rows are normally refreshed within a refresh window (tREFW) defined in a specification. In addition, the memory controller 1200 may issue the refresh management command at each time interval defined in the specification, or whenever the number of issuances of active commands ACT reaches a number of times defined in the specification.

The memory device 1100 may have substantially the same configuration as the memory device 10 of FIG. 1, the memory device 100 of FIG. 3, or the memory device 200 of FIG. 12. That is, in an embodiment of the present invention, the refresh window (tREFW) may be divided into two or more refresh cycles, and the row-hammer cells may be initialized while refreshing two or more rows for each refresh cycle. Therefore, the present invention may initialize the row-hammer cells without checking the counting data stored in the row-hammer cells, thereby minimizing the power consumption while maintaining the row-hammer attack defense capability.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A memory device comprising:

a memory cell array including a plurality of rows each of which is coupled to row-hammer cells configured to store a number of accesses of a corresponding row of the plurality of rows;

an address control circuit configured to generate consecutive first and second refresh addresses according to a single normal refresh command, wherein the first refresh address indicates an odd-numbered row during a first refresh cycle and an even-numbered row during a second refresh cycle; and a refresh control circuit configured to refresh, according to the single normal refresh command, first and second rows respectively corresponding to the first and second refresh addresses and selectively initialize the row-hammer cells of the first row while refreshing the first row.

2. The memory device of claim 1, wherein the first refresh cycle and the second refresh cycle are performed within a refresh window set to refresh all of the plurality of rows.

3. The memory device of claim 1, wherein the address control circuit generates the first and second refresh addresses by increasing each of the first and second refresh addresses by "+2" each time the single normal refresh command is input.

4. The memory device of claim 1, wherein the refresh control circuit selectively initializes the row-hammer cells of the first row by monitoring, during a refresh interval, the number of accesses of the first row.

5. The memory device of claim 4, wherein the refresh control circuit initializes the row-hammer cells of the first row when the monitored number is less than a preset threshold.

6. The memory device of claim 1, wherein the refresh control circuit is further configured to increase, according to an active command, counting data stored in the row-hammer cells of a row corresponding to a row address among the plurality of rows.

7. The memory device of claim 1, wherein the address control circuit includes:

a section control circuit configured to:

generate a section signal that defines the first refresh cycle and the second refresh cycle, and generate, according to the single normal refresh command, first and second internal refresh signals which are activated sequentially;

a first counter configured to generate the first refresh address, whose start point is determined according to the section signal and which increases by "+2" according to the first internal refresh signal; and a second counter configured to generate the second refresh address, whose start point is determined according to the start point of the first counter and which increases by "+2" according to the second internal refresh signal.

8. The memory device of claim 1, wherein the refresh control circuit includes:

a monitoring circuit configured to generate a row-hammer reset signal by monitoring, during a refresh interval, a number of accesses of a row corresponding to a monitoring address that is continuous from the second refresh address; and a row control circuit configured to sequentially refresh, according to the single normal refresh command, the first and second rows respectively corresponding to the first and second refresh addresses.

9. The memory device of claim 8, wherein the monitoring circuit includes:

a comparing circuit configured to generate a match signal by comparing the monitoring address with a row address input with an active command;

a counting circuit initialized according to the single normal refresh command and configured to generate an active counting value by counting a number of activations of the match signal; and a reset signal generation circuit configured to generate, according to the single normal refresh command, the row-hammer reset signal by comparing the active counting value with a preset threshold.

10. A memory device comprising:

a memory cell array including a plurality of rows each of which is coupled to row-hammer cells configured to store a number of accesses of a corresponding row of the plurality of rows;

an address control circuit configured to generate consecutive 2k refresh addresses according to a single normal refresh command, wherein the refresh addresses start from a starting refresh address indicating an n-th row during a first refresh cycle and a (n+k)-th row during a second refresh cycle; and a refresh control circuit configured to sequentially refresh, according to the single normal refresh command, 2k rows respectively corresponding to the 2k refresh addresses and selectively initialize the row-hammer cells of k rows among the 2k rows while first refreshing the k rows, wherein each of n and k is an integer greater than or equal to 1.

11. The memory device of claim 10, wherein the first refresh cycle and the second refresh cycle are performed within a refresh window set to refresh all of the plurality of rows.

12. The memory device of claim 10, wherein the address control circuit generates the 2k refresh addresses by increasing each of the 2k refresh addresses by "+2k" each time the single normal refresh command is input.

13. The memory device of claim 10, wherein the k is determined based on a number of adjacent rows to be refreshed during a target refresh operation.

14. The memory device of claim 10, wherein the refresh control circuit initializes the row-hammer cells of each of the first-refreshed k rows by monitoring, during a previous refresh interval, a number of accesses of each of the first-refreshed k rows.

15. An operating method of a memory device including a plurality of rows each of which is coupled to row-hammer cells configured to store a number of accesses of a corresponding row of the plurality of rows, the operating method comprising:

repeatedly performing, according to a single normal refresh command during a first refresh cycle, an operation of sequentially refreshing two consecutive rows starting from an odd-numbered row of the rows while selectively initializing the row-hammer cells of the odd-numbered row; and repeatedly performing, according to the single normal refresh command during a second refresh cycle, an operation of sequentially refreshing two consecutive rows starting from an even-numbered row of the rows while selectively initializing the row-hammer cells of the even-numbered row.

16. The operating method of claim 15, wherein the first refresh cycle and the second refresh cycle are performed within a refresh window set to refresh all of the plurality of rows.

17. The operating method of claim 15, wherein the selectively initializing the row-hammer cells of the odd-numbered row includes:

generating an active counting value by counting a number of accesses of the odd-numbered row during a previous refresh interval; and initializing the row-hammer cells of the odd-numbered row when the active counting value is less than a preset threshold.

18. The operating method of claim 15, further comprising increasing counting data stored in the row-hammer cells of a row activated according to an active command among the plurality of rows.

19. An operating method of a memory device including a plurality of rows each of which is coupled to row-hammer cells configured to store a number of accesses of a corresponding row of the plurality of rows, the operating method comprising:

repeatedly performing, according to a single normal refresh command during a first refresh cycle, an operation of sequentially refreshing consecutive 2k rows starting from an n-th row while selectively initializing row-hammer cells of k rows that are first refreshed among the 2k rows starting from the n-th row; and repeatedly performing, according to the single normal refresh command during a second refresh cycle, an operation of sequentially refreshing consecutive 2k rows starting from a (n+k)-th row while selectively initializing row-hammer cells of k rows that are first refreshed among the 2k rows starting from the (n+k)-th row, wherein each of k and n is an integer greater than or equal to 1.

20. The operating method of claim 19, wherein the first refresh cycle and the second refresh cycle are performed within a refresh window set to refresh all of the plurality of rows.

21. The operating method of claim 19, wherein the k is determined based on a number of adjacent rows to be refreshed during a target refresh operation.

22. The operating method of claim 19, wherein the selectively initializing the row-hammer cells includes:

generating k active counting values by respectively counting a number of accesses of the k rows during a previous refresh interval;

comparing the k active counting values with respective thresholds; and initializing the row-hammer cells of a selected row of the k rows, the active counting value of the selected row being less than a corresponding threshold of the thresholds.

* * * * *